United States Patent
Akashi et al.

(10) Patent No.: US 12,104,904 B2
(45) Date of Patent: Oct. 1, 2024

(54) SUPPORT STRUCTURE FOR MICRO-VIBRATOR AND METHOD OF MANUFACTURING INERTIAL SENSOR

(71) Applicants: DENSO CORPORATION, Kariya (JP); MIRISE Technologies Corporation, Nisshin (JP); TOYOTA JIDOSHA KABUSHIKI KAISHA, Toyota (JP)

(72) Inventors: Teruhisa Akashi, Nisshin (JP); Hirofumi Funabashi, Nisshin (JP); Yuuki Inagaki, Nisshin (JP)

(73) Assignees: DENSO CORPORATION, Kariya (JP); MIRISE Technologies Corporation, Nisshin (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 379 days.

(21) Appl. No.: 17/516,821

(22) Filed: Nov. 2, 2021

(65) Prior Publication Data
US 2022/0187072 A1    Jun. 16, 2022

(30) Foreign Application Priority Data
Dec. 16, 2020    (JP) ................... 2020-208757

(51) Int. Cl.
*B81C 1/00*    (2006.01)
*G01C 19/5691*    (2012.01)

(52) U.S. Cl.
CPC ...... *G01C 19/5691* (2013.01); *B81C 1/00182* (2013.01); *B81B 2201/0242* (2013.01)

(58) Field of Classification Search
CPC ........ G01C 19/5691; B81B 2201/0242; B81B 2201/0228; B81B 2201/025; B81C 3/001; B81C 1/00634
See application file for complete search history.

(56) References Cited

U.S. PATENT DOCUMENTS

| | | | |
|---|---|---|---|
| 2013/0160578 A1 | 6/2013 | Najafi et al. | |
| 2019/0094024 A1* | 3/2019 | Najafi | G01C 19/5691 |
| 2020/0216311 A1 | 7/2020 | Najafi et al. | |
| 2022/0049959 A1* | 2/2022 | Wu | B81B 7/007 |

FOREIGN PATENT DOCUMENTS

CN    110749315 A    2/2020

* cited by examiner

*Primary Examiner* — Moazzam Hossain
(74) *Attorney, Agent, or Firm* — Posz Law Group, PLC

(57) ABSTRACT

A support structure for a micro-vibrator includes: a micro-vibrating body having a curved surface portion and a recess recessed from the curved surface portion; and a support member having a rod and an adhesive member arranged at a tip end of the rod. The support member is adhered on a connecting surface of the recess through the adhesive member. The connecting surface of the recess is an internal bottom surface of the recess.

4 Claims, 20 Drawing Sheets

SUPPORT STRUCTURE FOR MICRO-VIBRATOR AND METHOD OF MANUFACTURING INERTIAL SENSOR

CROSS REFERENCE TO RELATED APPLICATION

This application is based on Japanese Patent Application No. 2020-208757 filed on Dec. 16, 2020, the disclosure of which is incorporated herein by reference in its entirety.

TECHNICAL FIELD

The present disclosure relates to a support structure for a micro-vibrator and a method of manufacturing an inertial sensor.

BACKGROUND

In recent years, a gyro sensor is developed for realizing a highly sensitive inertial measurement unit (IMU) in which a micro-vibrating body is mounted on a substrate.

SUMMARY

A support structure for a micro-vibrator includes: a micro-vibrating body having a curved surface portion and a recess recessed from the curved surface portion; and a support member having a rod and an adhesive member arranged at a tip end of the rod. The support member is adhered on a connecting surface of the recess through the adhesive member. The connecting surface of the recess is an internal bottom surface of the recess.

DESCRIPTION OF EMBODIMENT

Figure 1:
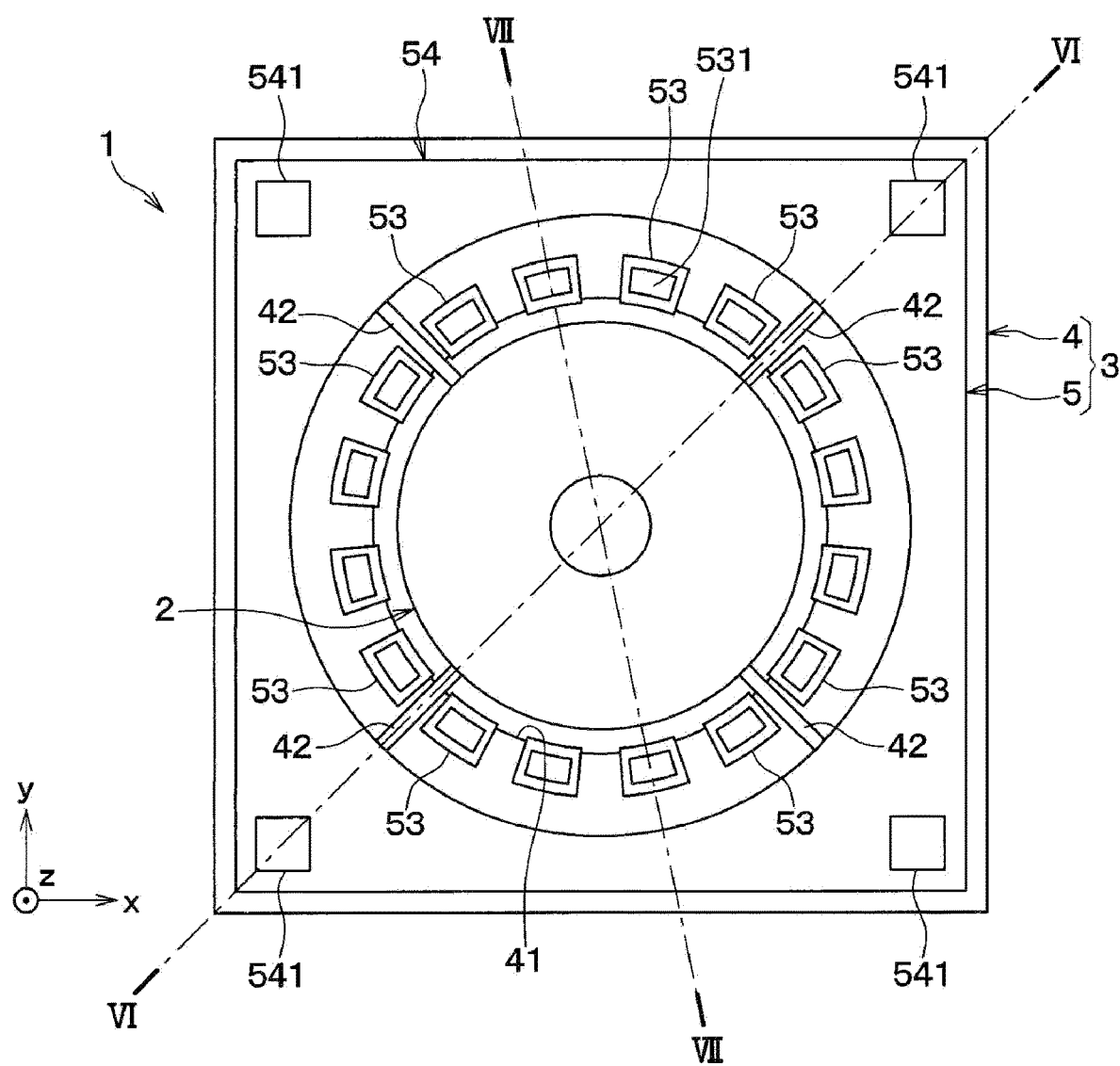
FIG. 1 is a plan view illustrating an inertial sensor according to a first embodiment.

To begin with, examples of relevant techniques will be described.

In recent years, an automatic vehicle driving system is developed, and a highly accurate self-position estimation technique is required in this system. For example, for so-called Level-3 autonomous driving, a self-position estimation system is developed, which is equipped with a global navigation satellite system (GNSS) and an inertial measurement unit (IMU). The IMU is, for example, a six-axis inertial force sensor composed of three-axis gyro sensor and three-axis acceleration sensor. In order to realize so-called Level-4 or higher autonomous driving, an IMU with higher sensitivity than the current one is required.

As a gyro sensor for realizing such a highly sensitive IMU, there is a bird-bath resonator gyroscope (BRG) in which a micro-vibrating body is mounted on a substrate, and the micro-vibrating body has a three-dimensional curved surface that vibrates in a wineglass vibration mode. Since the Q value (Quality factor) representing the vibration state reaches $10^6$ or more, higher sensitivity than before can be expected to the micro-vibrating body.

Since the micro-vibrating body is made of, for example, quartz having a thickness of several tens μm, it is required to carefully handle it not to be damaged when the micro-vibrating body is mounted on a substrate. If the base material (for example, quartz) of the micro-vibrating body is scratched or an electrode film formed on the surface is peeled off, the Q value (Quality factor) decreases and the sensitivity of the gyro sensor decreases.

There is a movable jig for positioning the micro-vibrating body of the BRG as a part of the substrate. The micro-vibrating body is placed on the substrate, and the position of the micro-vibrating body is adjusted by the movable jig. Then, the micro-vibrating body is joined to the substrate to complete the manufacturing. However, the micro-vibrating body and its electrode film may be damaged depending on a specific method for transporting the micro-vibrating body when positioning the micro-vibrating body.

The present disclosure provides a micro-vibrator for an inertial sensor to suppress damage to a micro-vibrating body when the micro-vibrating body is mounted on a substrate.

According to an aspect of the present disclosure, a support structure for a micro-vibrator includes: a micro-vibrating body having a curved surface portion having an annular curved surface and a recess recessed from the curved surface portion; and a support member having a rod and an adhesive member arranged at a tip end of the rod. The support member is adhered on a connecting surface of the recess through the adhesive member, and the connecting surface is an internal bottom surface of the recess.

Accordingly, it is not necessary to directly support the curved surface portion of the micro-vibrating body, due to the support structure in which the micro-vibrating body is connected via the support member. It is possible to suppress damage to the micro-vibrating body during transportation of the micro-vibrating body. Further, when the electrode film is formed on the micro-vibrating body, a part of the micro-vibrating body on which the electrode film is formed has no contact, so that the peeling of the electrode film is suppressed and the vibration characteristics can be maintained.

According to another aspect of the present disclosure, an inertial sensor includes a micro-vibrating body and a substrate. The micro-vibrating body has a curved surface portion having an annular curved surface and a recess recessed from the curved surface portion. The recess of the micro-vibrating body is mounted in an inner region of a frame-shaped mounting portion of the substrate. The curved surface portion is in a hollow state. A method of manufacturing the inertial sensor includes: preparing the micro-vibrating body; preparing a support member having a rod and an adhesive member arranged at a tip end of the rod; inserting the tip end of the rod into the recess of the micro-vibrating body to bring the adhesive member into close contact with a connecting surface which is an internal bottom surface of the recess; melting and solidifying the adhesive member in a state where the adhesive member is in close contact with the connecting surface, to form a support structure in which the rod and the micro-vibrating body are connected to each other; forming a conductive layer on a surface of the micro-vibrating body after forming the support structure; applying a joining member to the inner region of the mounting portion of the substrate; conveying the micro-vibrating body using the rod of the support structure to bring a mounting surface, which is a bottom surface of the micro-vibrating body outside of the recess, into contact with the joining member; joining the micro-vibrating body and the substrate by solidifying the joining member after heating the substrate to melt the joining member and the adhesive member; and removing the rod from the micro-vibrating body after joining the micro-vibrating body to the substrate.

Accordingly, in the method for manufacturing an inertial sensor, a support structure is formed in which the support member is connected to the micro-vibrating body. Then, the micro-vibrating body is mounted on the substrate with the support structure as it is. The rod is removed from the micro-vibrating body after joining the micro-vibrating body to the substrate. In this manufacturing method, via the support structure, the micro-vibrating body is conveyed, the conductive layer is formed, and the micro-vibrating body is mounted on the substrate. The rod is removed after these steps. Therefore, it is not necessary to directly support the micro-vibrating body in a series of steps. Thus, it is possible to suppress damage to the micro-vibrating body and the conductive layer. Accordingly, it is possible to manufacture a highly reliable and highly sensitive inertial sensor.

The reference numerals attached to the components and the like indicate an example of correspondence between the components and the like and specific components and the like in embodiments to be described below.

Hereinafter, embodiments of the present disclosure will be described with reference to the drawings. In the following embodiments, the same reference numerals are assigned to portions that are the same or equivalent to each other for description.

First Embodiment

An inertial sensor 1 and a support structure 100 for a micro-vibrating body 2 of the inertial sensor 1 according to a first embodiment will be described with reference to the drawings.

Figure 2:
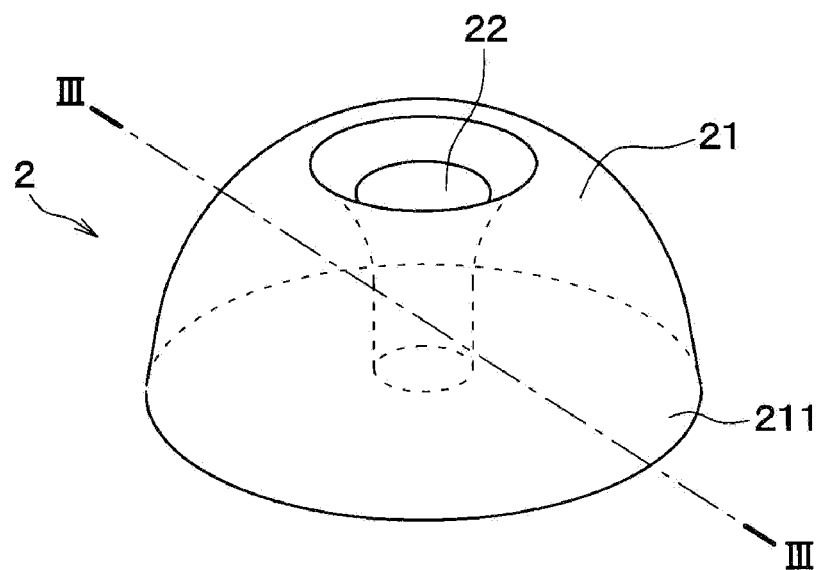
FIG. 2 is a perspective view illustrating a micro-vibrating body.

Hereinafter, for convenience of explanation, as shown in FIG. 1, "x direction" is defined along the left-right direction on the paper surface, "y direction" is orthogonal to the x direction on the paper surface, and "z direction" is a normal direction to the xy plane. The x, y, and z directions in the other drawings such as FIG. 2 correspond to the x, y, and z directions in FIG. 1, respectively. Further, the "upper side" in the present specification is an arrow direction along the z direction in the drawings, and the "lower side" means the opposite side of the upper side. Further, in the present specification, for example, as shown in FIG. 1, "top view" represents a state in which the inertial sensor 1 is viewed from the upper side in the z direction. In FIG. 2, in order to make the configuration easy to understand, a broken line shows a part of the shape of a curved surface portion 21 and a recess 22 which cannot be seen at the angle shown in FIG. 2.

As shown in FIG. 1, the inertial sensor 1 of the present embodiment includes a micro-vibrating body 2 and a substrate 3. A part of the micro-vibrating body 2 is joined to the substrate 3. The inertial sensor 1 is configured to detect an angular velocity applied to the inertial sensor 1 based on a change in capacitance between the micro-vibrating body 2 capable of vibrating in a wineglass vibration mode and an electrode portions 53 formed on the substrate 3, which will be described later. The inertial sensor 1 is, for example, a gyro sensor having a bird-bath resonator gyroscope (BRG) structure, and is suitably mounted on a vehicle such as an automobile. However, the inertial sensor 1 can also be applied to the other applications.

Figure 3:
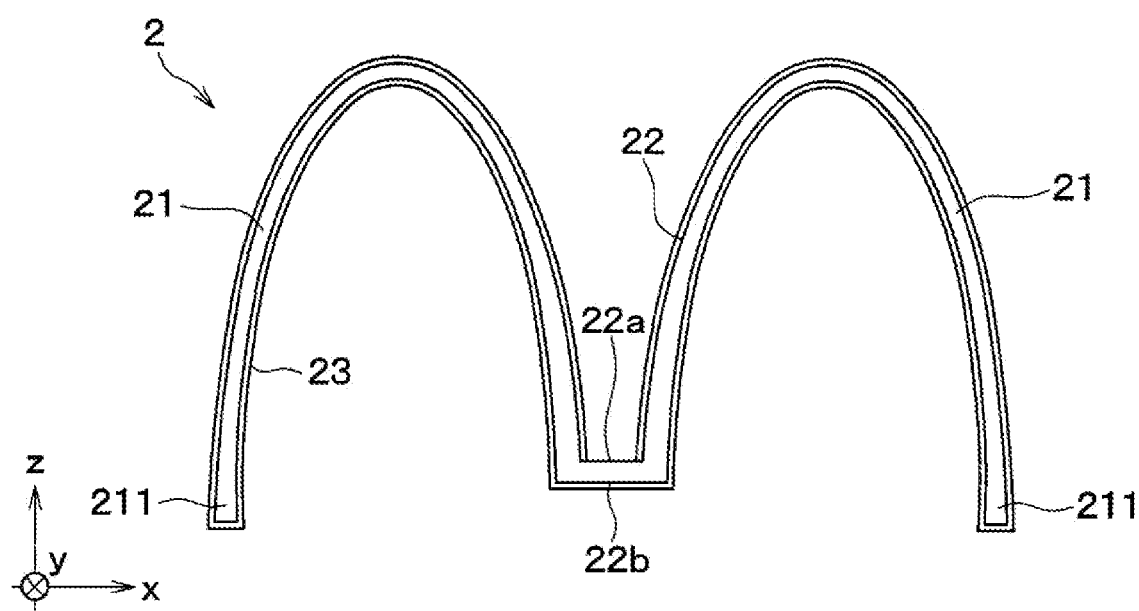
FIG. 3 is a view taken along a line III-III of FIG. 2.

As shown in FIG. 2, the micro-vibrating body 2 has a curved surface portion 21 and a recess 22. The curved surface portion 21 has an outer shape of a substantially hemispherical three-dimensional curved surface. The recess 22 is recessed toward the center of the sphere from the apex of the curved surface portion 21 having an annular curved surface shape. As shown in FIG. 3, the recess 22 of the micro-vibrating body 2 has a connecting surface 22a and a mounting surface 22b. A support member 6 to be described later is connected to the connecting surface 22a when the inner bottom surface of the recess 22 is mounted on the substrate 3. The mounting surface 22b, which is an outer bottom surface of the recess 22 opposite to the connecting surface 22a is joined to the substrate 3.

The diameter of the mounting surface 22b of the micro-vibrating body 2 is smaller than the diameter of the inner region of the frame-shaped mounting portion 51 of the substrate 3, which will be described later. When the micro-vibrating body 2 is mounted to the substrate 3, the micro-vibrating body 2 is configured not to come into contact with the mounting portion 51. The micro-vibrating body 2 includes the rim 211 having a substantially cylindrical shape so that the distance between the rim 211 and the electrode portion 53 is constant, when the inertial sensor 1 is not driven. The micro-vibrating body 2 can vibrate in the wineglass vibration mode, when the mounting surface 22b of the recess 22 is mounted to the substrate 3, since a three-dimensional curved surface of the micro-vibrating body 2 including the rim 211 is in a hollow state. The curved surface portion 21 of the micro-vibrating body 2 has a bowl-shaped three-dimensional curved surface, and the Q value of the vibration is, for example, $10^6$ or more.

The micro-vibrating body 2 is made of a material such as quartz, glass, silicon, or ceramic, but is not limited to, while being able to vibrate in wineglass vibration mode with the curved surface portion 21 having the three-dimensional curved surface shape and the recess 22. The micro-vibrating body 2 has a thin structure of several tens of μm, such as a thickness of 20 μm to 80 μm. The micro-vibrating body 2 has a millimeter-sized shape, for example, with a dimension of 2.5 mm in the height direction along the thickness direction of the substrate 3 and with a diameter of 5 mm.

Figure 8A:
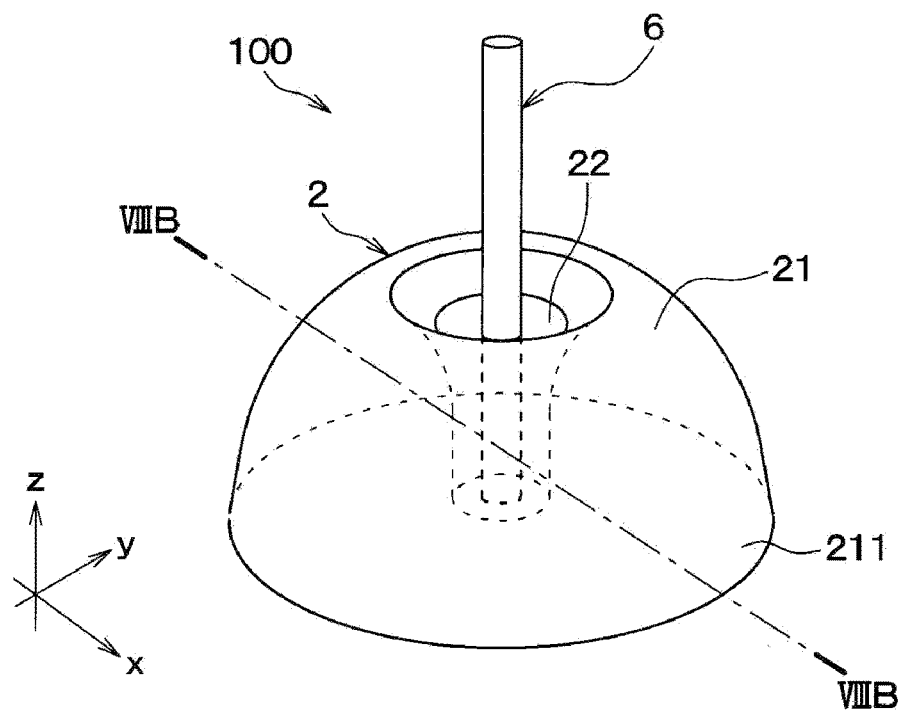
FIG. 8A is a perspective view illustrating a support structure for the micro-vibrating body according to the first embodiment.

The micro-vibrating body 2 is covered with a conductive layer 23, except for a part of the surface, after the support structure 100 shown in FIG. 8A is formed by connecting the support member 6 to the connecting surface 22a. The conductive layer 23 functions as an electrode film, and is made of a laminated film of arbitrary conductive materials such as Cr (chromium), Ti (titanium), Au (gold) or Pt (platinum) from the base side. The micro-vibrating body 2 has an inner surface adjacent to the mounting surface 22b and an outer surface opposite to the inner surface. The conductive layer 23 is formed on at least the rim 211 of the inner surface and the outer surface, so that the mounting surface 22b has the same potential as the outside of the rim 211. As shown in FIG. 3, the conductive layer 23 is not formed at least the connecting surface 22a of the micro-vibrating body 2 to which the support member 6 is connected, since the conductive layer 23 is formed after the micro-vibrating body 2 forms the support structure 100.

The shape of the micro-vibrating body 2 is formed by, for example, the following processes.

Figure 4A:
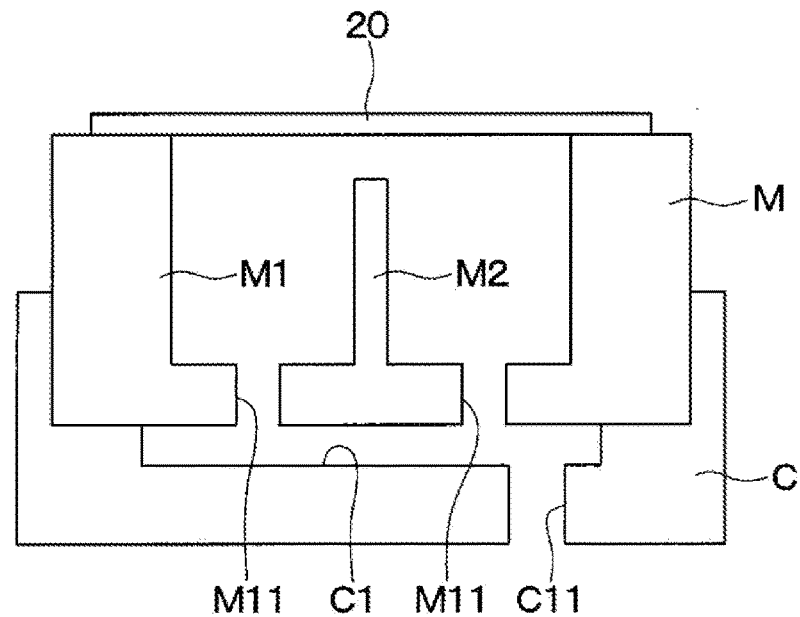
FIG. 4A is a view illustrating a preparation step in a process of forming the micro-vibrating body of FIG. 2.

First, for example, as shown in FIG. 4A, a quartz plate 20, a mold M for forming a three-dimensional curved surface shape, and a cooling body C for cooling the mold M are prepared. The mold M includes, for example, a recess M1 and a support column M2. The recess M1 serves as a space for forming a three-dimensional curved surface shape on the quartz plate 20. The support column M2 extends along the depth direction of the recess M1 at the center of the recess M1 to support a part of the quartz plate 20 when processing. A through hole M11 is formed to pass through the bottom surface of the recess M1. The cooling body C has a fitting portion C1 into which the mold M is fitted and an exhaust port C11 for exhaust in the bottom surface of the fitting portion C1. The cooling body C cools the mold M when processing the quartz plate 20. The quartz plate 20 is arranged so as to cover the entire area of the recess M1 of the mold M.

Figure 4B:
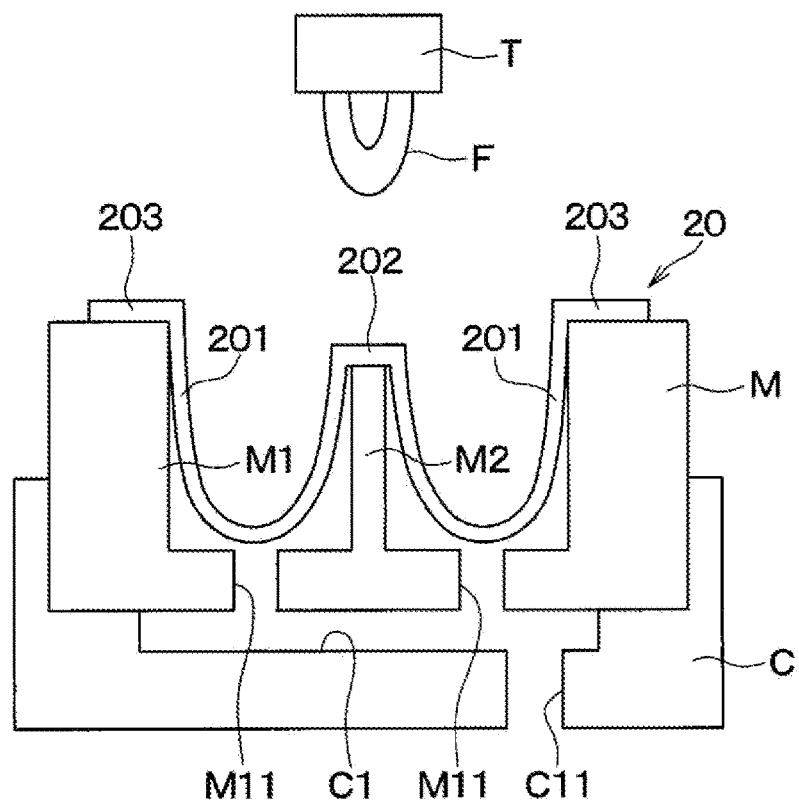
FIG. 4B is a view illustrating a process of forming the micro-vibrating body, following FIG. 4A.

Subsequently, as shown in FIG. 4B, a flame F is sprayed from a torch T toward the quartz plate 20 to melt the quartz plate 20. At this time, air in the recess M1 of the mold M is evacuated through the exhaust port C11 of the cooling body C by a vacuum mechanism (not shown). As a result, the melted quartz is stretched toward the bottom surface of the recess M1 and is supported by the support column M2 at the central region. After that, the heating of the quartz plate 20 is stopped to cool. Thus, the quartz plate 20 is shaped to have the curved surface portion 201 shaped in a substantially hemispherical three-dimensional curved surface, the recess 202 recessed near the center of the curved surface portion 201, and the flat end portion 203.

Figure 4C:
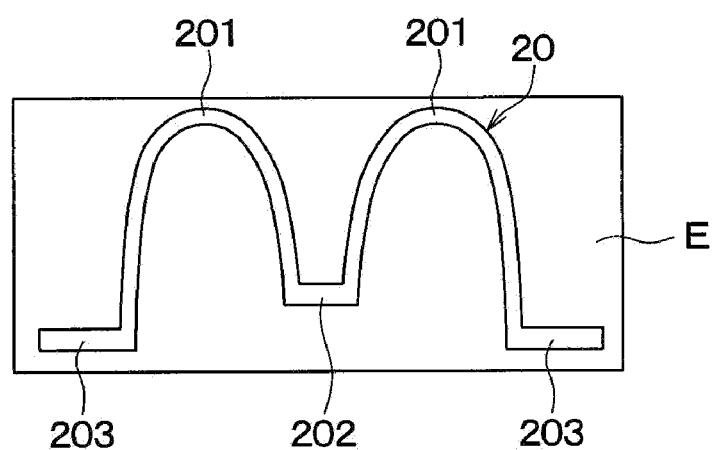
FIG. 4C is a view illustrating a process of forming the micro-vibrating body, following FIG. 4B.

Next, the recess M1 of the mold M is returned to be under normal pressure, and the processed quartz plate 20 is removed. As shown in FIG. 4C, the quartz plate 20 is sealed with a sealing material E made of an arbitrary curable resin material. After that, the surface of the sealing material E adjacent to the end portion 203 is polished and a chemical mechanical polishing (CMP) is performed, such that the end portion 203 is removed together with the sealing material E, so as to leave the recess 202. Then, all the sealing material E is removed by an arbitrary method such as heating or melting with a chemical solution, and the quartz plate 20 is taken out.

The micro-vibrating body 2 is manufactured by, for example, the manufacturing processes as described above, and has a substantially half-toroidal shape that is rotationally symmetric with the z direction as the rotation axis. However, the manufacturing method is not limited to the above method, and the other known method may be adopted.

The connecting surface 22a of the micro-vibrating body 2 is connected to the support member 6 described later, to form the support structure 100 shown in FIG. 8A. The micro-vibrating body 2 is mounted on the substrate 3 in the state of the support structure 100 to which the support member 6 is connected. Therefore, it is possible to restrict the base material and the conductive layer 23 covering the base material from being scratched. The details will be described later.

Figure 5:
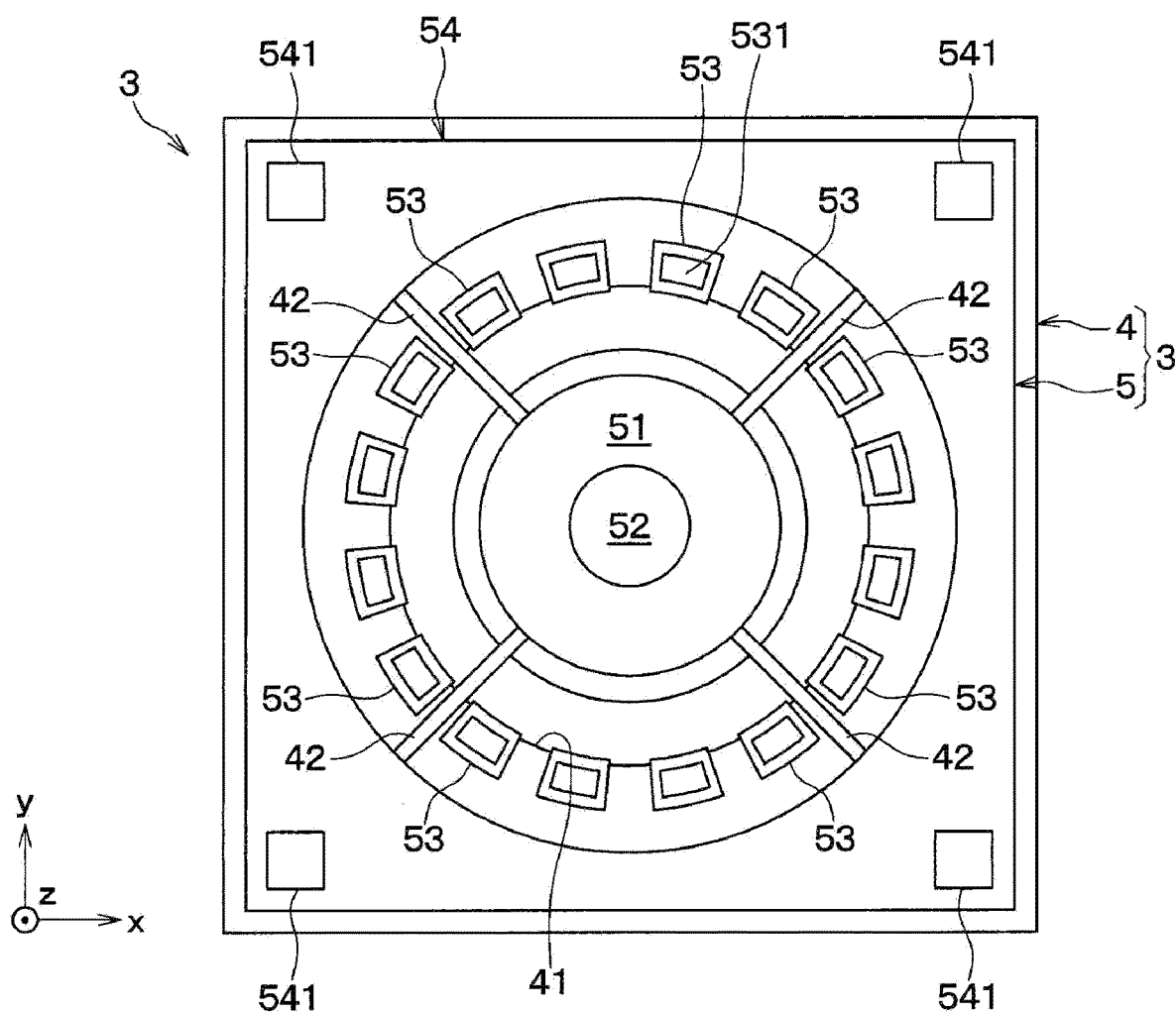
FIG. 5 is a plan view illustrating a substrate before the micro-vibrating body is mounted.

As shown in FIG. 5, the substrate 3 includes a lower substrate 4 and an upper substrate 5 joined to each other. For example, the substrate 3 can be obtained by anode-bonding the upper substrate 5 made of Si (silicon), which is a semiconductor material, to the lower substrate 4 made of borosilicate glass, which is an insulating material. The substrate 3 has a mounting portion 51, an electrode portion 53 and an outer frame portion 54. The micro-vibrating body 2 is mounted on the mounting portion 51. The electrode portions 53 are arranged apart from each other so as to surround the mounting portion 51. The outer frame portions 54 are arranged and separated from each other so as to surround the electrode portion 53.

Figure 6:
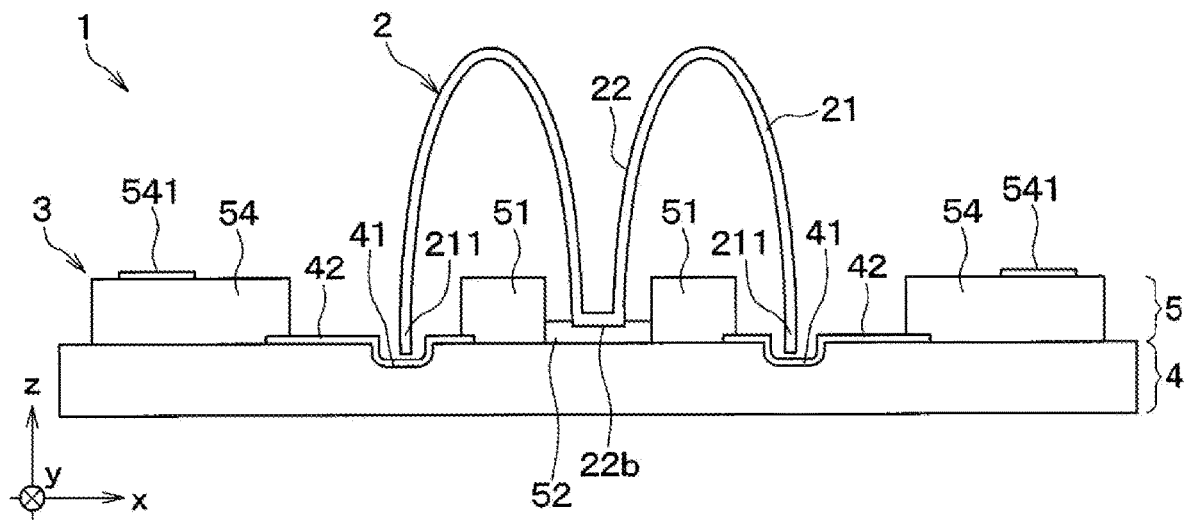
FIG. 6 is a view taken along a line VI-VI of FIG. 1.
Figure 7:
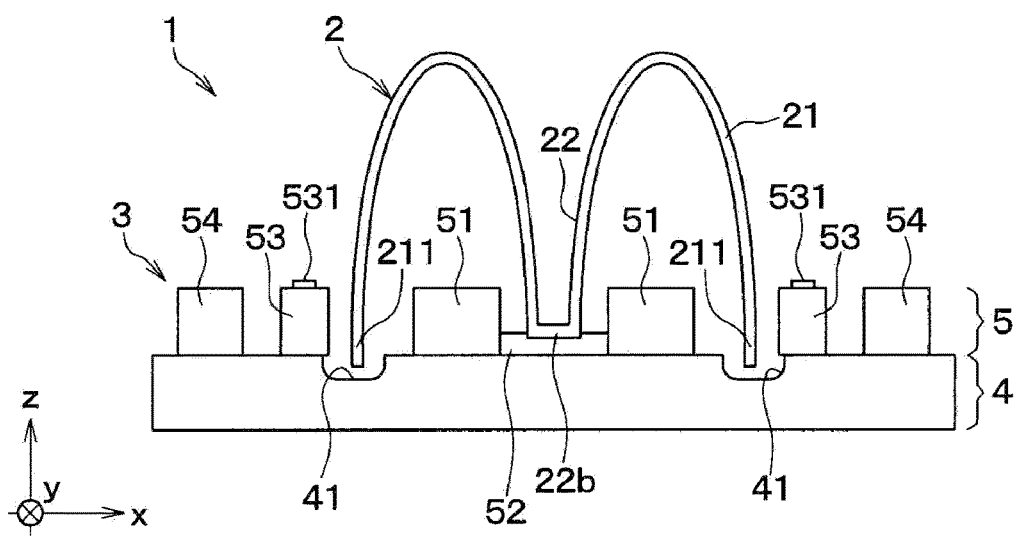
FIG. 7 is a view taken along a line VII-VII of FIG. 1.

As shown in FIGS. 5 and 6, the substrate 3 has an annular etching groove 41 surrounding the mounting portion 51 at a position on the outer peripheral side of the annular mounting portion 51. As a result, when the micro-vibrating body 2 is mounted on the substrate 3, as shown in FIGS. 6 and 7, the curved surface portion 21 of the micro-vibrating body 2 including the rim 211 is in the hollow state. The substrate 3 includes a bridge wiring 42 that straddles the etching groove 41 of the lower substrate 4. The mounting portion 51 and the four outer frame portions 54 are electrically connected to have the same potential. The bridge wiring 42 is made of a conductive material such as Al (aluminum) and is arranged to extend between the electrode portions 53. The bridge wiring 42 is electrically independent of the electrode portion 53. In FIGS. 6 and 7, the conductive layer 23 of the micro-vibrating body 2 is omitted for easy viewing.

A joining member 52 such as Au paste is applied to, for example, the inner region of the annular mounting portion 51. The substrate 3 and the micro-vibrating body 2 are joined via the joining member 52. Alternatively, the joining member 52 may be a conductive paste containing nanoparticles such as Ag (silver) and Cu (copper), or eutectic solder material such as AuSn, AlGe, and CuSn. In the present embodiment, the joining member 52 may be made of a material having a melting point higher than that of the adhesive member 62. Further, one end of the bridge wiring 42 is covered with the mounting portion 51, and the other end of the bridge wiring 42 is covered with the outer frame portion 54, in the substrate 3. As a result, when the micro-vibrating body 2 is mounted on the substrate 3, the mounting portion 51, the bridge wiring 42, and the outer frame portion 54 are electrically connected to the micro-vibrating body 2.

Note that FIG. 5 shows a typical case where the four bridge wirings 42 are formed on the substrate 3, but not limited to this case. The number and arrangement of the bridge wirings 42 are appropriately changed.

As shown in FIGS. 5 and 7, the substrate 3 includes the electrode portions 53 arranged apart from each other so as to surround the mounting portion 51 at a position on the outer peripheral side of the etching groove 41. When the micro-vibrating body 2 is mounted, the electrode portions 53 are distanced from the rim 211 of the micro-vibrating body 2 by a predetermined distance, and each of the electrode portions 53 forms a capacitor with the micro-vibrating body 2. An electrode film 531 is formed on the upper surface of the electrode portion 53. For example, a wire (not shown) is connected to the electrode film 531 to be electrically connected to an external circuit board (not shown). As a result, the substrate 3 detects the capacitance between the substrate 3 and the micro-vibrating body 2 via the electrode portions 53, or generates an electrostatic attraction with the micro-vibrating body 2, such that the micro-vibrating body 2 vibrates in the wineglass vibration mode. As shown in FIG. 1 which is a view from the upper side, the electrode portion 53 has an arcuate shape on the inner peripheral side and the outer peripheral side. When the inner peripheral sides are connected with each other and the outer peripheral sides are connected to each other, intermittent circles with different diameters are shown. In other words, the electrode portions 53 divide an annulus surrounding the mounting portion 51 evenly at a predetermined interval.

The "inner peripheral side" of the substrate 3 means the central side on the inner region of the mounting portion 51 in the top view such as FIG. 5, and the "outer peripheral side" means a side located opposite to the inner peripheral side. FIG. 1 illustrates the sixteen electrode portions 53 evenly arranged apart from each other on the substrate 3 so as to form a ring, but not limited to this. The number and arrangement of the electrode portions 53 can be appropriately changed according to the shape, size, and the like of the micro-vibrating body 2.

As shown in FIG. 5, the outer frame portion 54 is arranged to surround the electrode portions 53 on the outer peripheral side of the electrode portions 53. The inner peripheral side of the outer frame portion 54 has, for example, an arc shape along the outer peripheral surface of the electrode portion 53 in the top view. As shown in FIGS. 5 and 6, the outer frame portion 54 has the electrode film 541 made of Al or the like on the upper surface thereof. A wire (not shown) is connected to the electrode film 541 to electrically connect an external circuit board (not shown). As a result, the substrate 3 can control the potential of the micro-vibrating body 2 to a desired value via the outer frame portion 54 by an external power source (not shown) connected to the electrode film 541.

Note that FIG. 5 illustrates a typical case where the electrode film 541 is formed at the four corners of the outer frame portion 54 of the substrate 3, but not limited to this. The number and arrangement of the electrode films 541 can be changed as appropriate.

The substrate 3 can be manufactured by, for example, the following process.

First, the lower substrate 4 made of, for example, borosilicate glass is prepared, and the annular etching groove 41 is formed by wet etching using buffered hydrofluoric acid. After that, the bridge wiring 42 straddling the etching groove 41 is formed by a lift-off method using film formation by sputtering Al. The thickness of the bridge wiring 42 is, for example, about 0.1 μm.

Subsequently, a Si substrate made of Si is prepared for forming the upper substrate 5 and anode-bonded to the lower substrate 4 made of the borosilicate glass. Next, a groove is formed on the Si substrate by a known etching method for partitioning the region to be the mounting portion 51, the electrode portion 53, and the outer frame portion 54.

Then, trench etching is performed by, for example, a deep reactive ion etching (DRIE) to expose the lower substrate 4, so as to separate the region into the mounting portion 51, the electrode portion 53, and the outer frame portion 54. As a result, the Si substrate is processed to the upper substrate 5 including the mounting portion 51, the electrode portion 53, and the outer frame portion 54 separated from each other.

Finally, after forming the electrode film 531, 541 on the upper surface of the electrode portion 53 and the outer frame portion 54 by, for example, sputtering or the like, the joining member 52 is applied to the inner region of the mounting portion 51 by a dispenser.

FIG. 5 illustrates the substrate 3 obtained, for example, by dicing cut a wafer having the substrates 3 to separate from each other. That is, the substrate 3 can be manufactured at the wafer level.

The above is the basic configuration of the inertial sensor 1. When the inertial sensor 1 is driven, the micro-vibrating body 2 vibrates in the wineglass vibration mode by generating an electrostatic attraction between a part of the electrode portions 53 and the micro-vibrating body 2. When Coriolis force is applied to the inertial sensor 1 from the outside while the micro-vibrating body 2 is in the vibrating state, the micro-vibrating body 2 is displaced and the position of the node of the vibration mode changes. The inertial sensor 1 can detect the angular velocity acting on the inertial sensor 1 by detecting the change in the node of the vibration mode by the capacitance between the micro-vibrating body 2 and the electrode portions 53.

In the manufacture of the inertial sensor 1, the support structure 100 described below is configured, such that the micro-vibrating body 2 is easily mounted on the substrate 3, while suppressing damage on the micro-vibrating body 2.

Figure 8B:
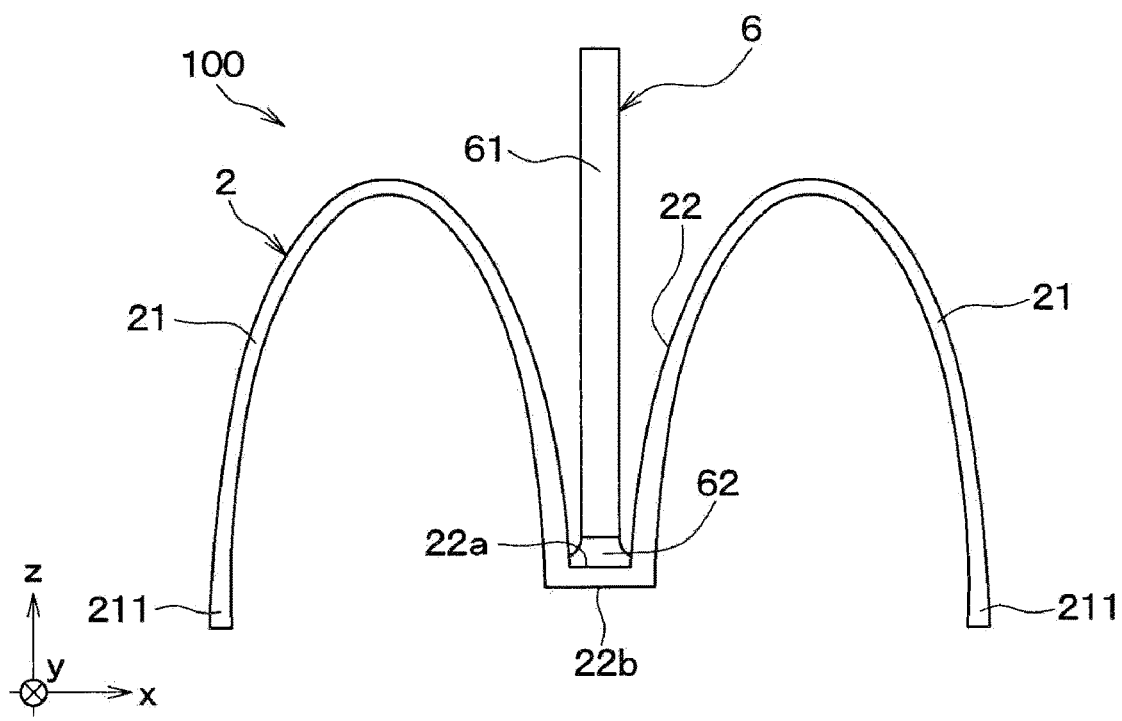
FIG. 8B is a view taken along a line VIIIB-VIIIB of FIG. 8A.

Next, the support structure 100 for the micro-vibrating body 2 will be described with reference to FIGS. 8A and 8B when the inertial sensor 1 is manufactured. In FIG. 8A, in order to make the configuration easy to understand, similarly to FIG. 2, a part of the curved surface portion 21, the recess 22 and the support member 6 which cannot be seen at the angle shown in FIG. 8A is shown by a broken line.

As shown in FIG. 8A, in the support structure 100, the support member 6 is inserted into the recess 22 of the micro-vibrating body 2 and the support member 6 is connected to the micro-vibrating body 2 at the bottom surface of the recess 22. Specifically, as shown in FIG. 8B, the support structure 100 includes the micro-vibrating body 2 and the support member 6 having the rod 61 and the adhesive member 62 arranged at the tip of the rod 61. The rod 61 is adhered to the connecting surface 22a of the recess 22 of the micro-vibrating body 2 via the adhesive member 62.

The support member 6 is used to enable post-processes such as transporting the micro-vibrating body 2 and forming the conductive layer 23 without directly gripping the micro-vibrating body 2. The support member 6 includes the rod 61 and the adhesive member 62. The adhesive member 62 is arranged on the tip surface of the rod 61.

The diameter of the rod 61 about the longitudinal direction (the extending direction of the rod 61) is smaller than the inner diameter of the recess 22. The length of the rod 61 in the extending direction is larger than the depth of the recess 22. In other words, the rod 61 has a shape and dimensions such that the rod 61 is inserted in the recess 22 without contacting the connecting surface 22a, and a part of the rod 61 protrudes from the recess 22 of the micro-vibrating body 2. The rod 61 has, for example, a columnar shape, but is not limited to this. The rod 61 may have other shapes such as a square columnar shape and a polygonal columnar shape. The rod 61 is made of the same material as the micro-vibrating body 2 such as quartz, glass, silicon or ceramic. The rod 61 may be made of a material different from that of the micro-vibrating body 2 while the rod 61 is made of a material having a melting point higher than that of the adhesive member 62 and the joining member 52. The rod 61 is removed from the micro-vibrating body 2 after the micro-vibrating body 2 is joined to the substrate 3.

The adhesive member 62 is used for temporarily adhering the micro-vibrating body 2 and the rod 61. In the present embodiment, the adhesive member 62 is made of a material having a melting point lower than that of the joining member 52. The adhesive member 62 is made of low-melting-point glass that melts at a temperature of about 220° C. to 300° C. when the joining member 52 is made of a material such as Au paste that can be bonded at a temperature of 350° C. to 400° C. In this case, the rod 61 can be removed from the micro-vibrating body 2, since the adhesive member 62 is melted while maintaining the state in which the micro-vibrating body 2 is fixed to the substrate 3 after the micro-vibrating body 2 is joined to the substrate 3 by melting and solidifying the joining member 52. The adhesive member 62 is not limited to be made of the low-melting-point glass, and the material can be changed as appropriate, while the adhesive member 62 is made of a material which does not melt at a temperature in a post-process before mounting the micro-vibrating body 2 on the substrate 3, but melts at a temperature lower than the melting point of the joining member 52.

The above is the basic configuration of the support structure 100 of the present embodiment. Due to the support structure 100, it is possible to grip the support member 6 to convey the micro-vibrating body 2 and form the conductive layer 23, so that the micro-vibrating body 2 can be easily suppressed from being damaged and the conductive layer 23 is restricted from being peeled off.

Next, the manufacturing method of the inertial sensor 1 of the present embodiment will be described with reference to FIGS. 9A to 9K. The formation of the support structure 100 and the implementation of the micro-vibrating body 2 using the support structure 100 will be mainly described, since the manufacturing of the micro-vibrating body 2 and the substrate 3 has been described above.

Figure 9A:
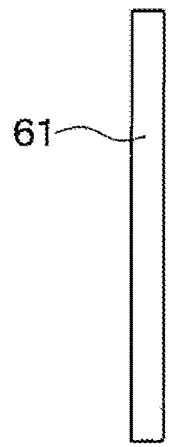
FIG. 9A is a view illustrating a process of preparing a rod for the support structure for the micro-vibrating body in the manufacturing process of the inertial sensor according to the first embodiment.
Figure 9B:
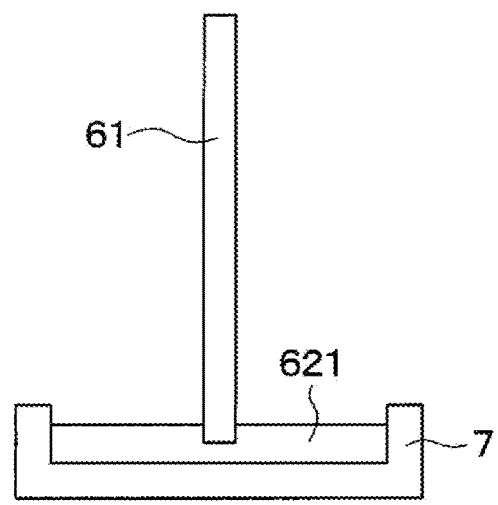
FIG. 9B is a view illustrating a manufacturing process of the inertial sensor, following FIG. 9A.
Figure 9C:
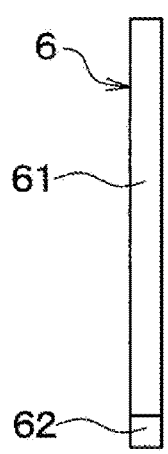
FIG. 9C is a view illustrating a manufacturing process of the inertial sensor, following FIG. 9B.
Figure 9D:
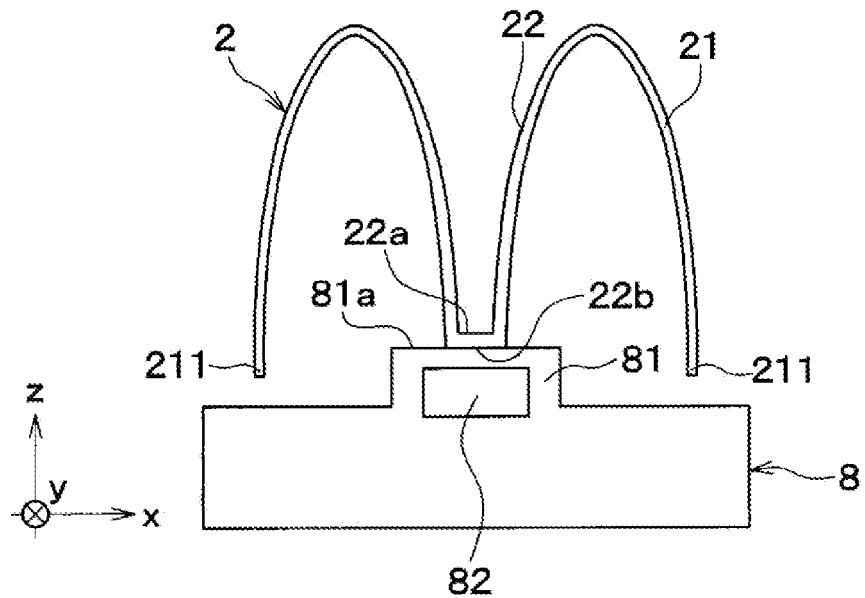
FIG. 9D is a view illustrating a manufacturing process of the inertial sensor, following FIG. 9C.
Figure 9E:
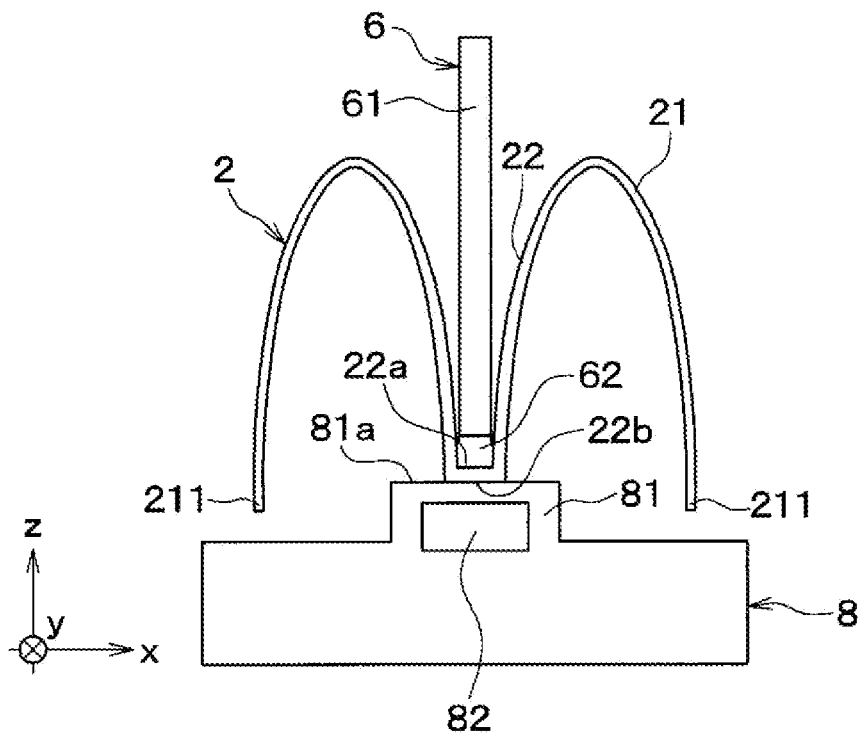
FIG. 9E is a view illustrating a manufacturing process of the inertial sensor, following FIG. 9D.
Figure 9F:
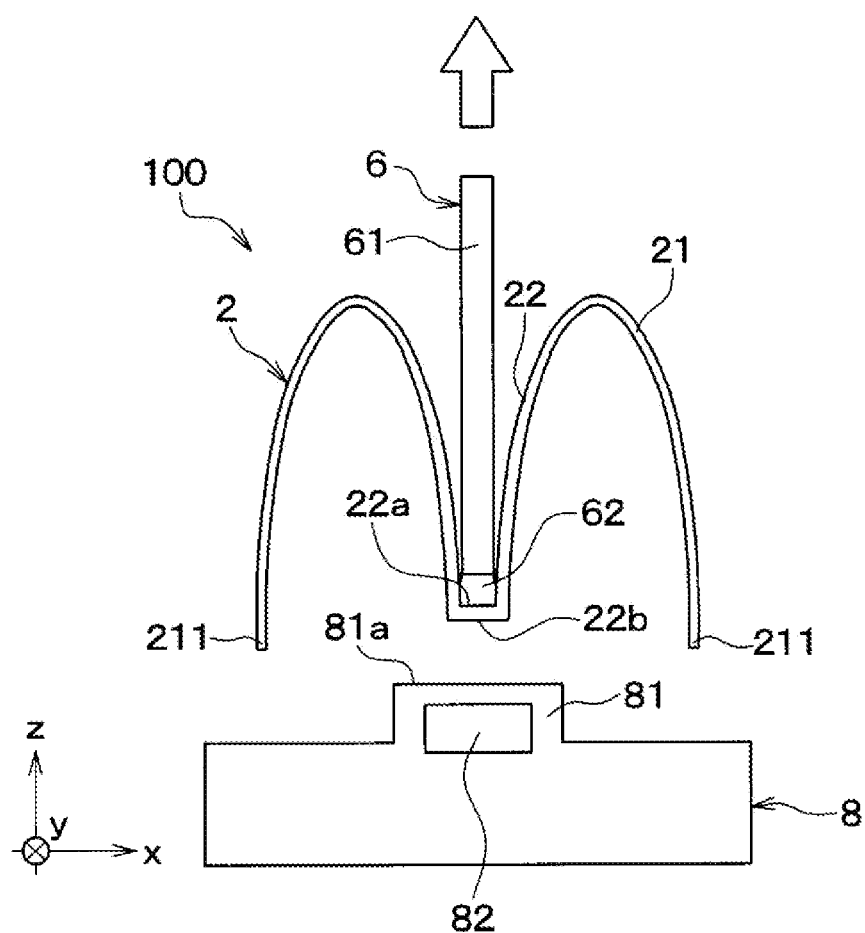
FIG. 9F is a view illustrating a manufacturing process of the inertial sensor, following FIG. 9E.
Figure 9G:
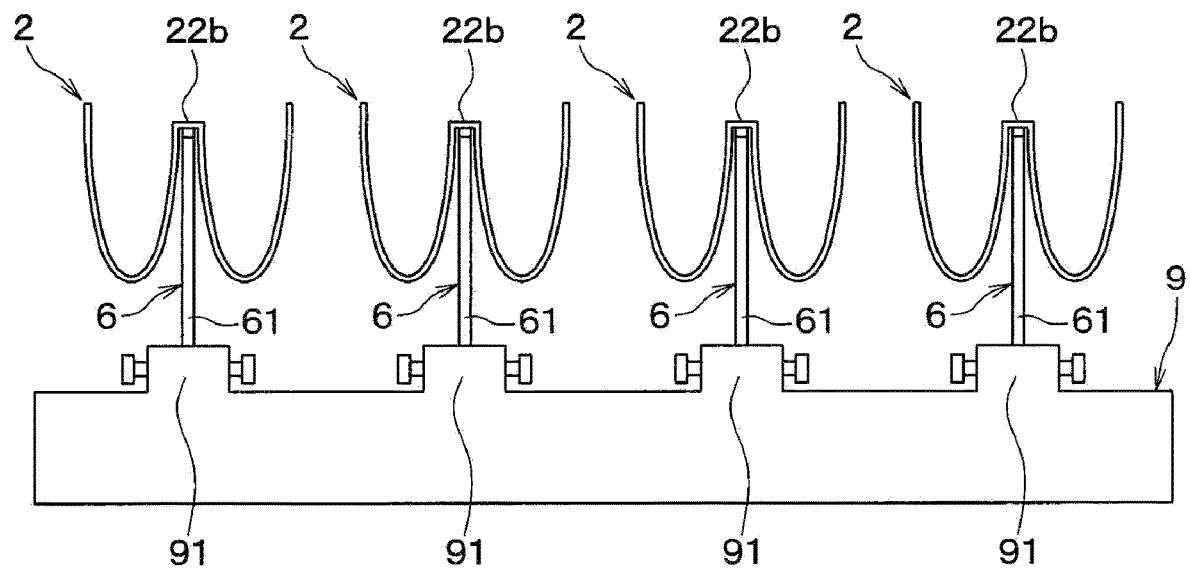
FIG. 9G is a view illustrating a manufacturing process of the inertial sensor, following FIG. 9F.
Figure 9H:
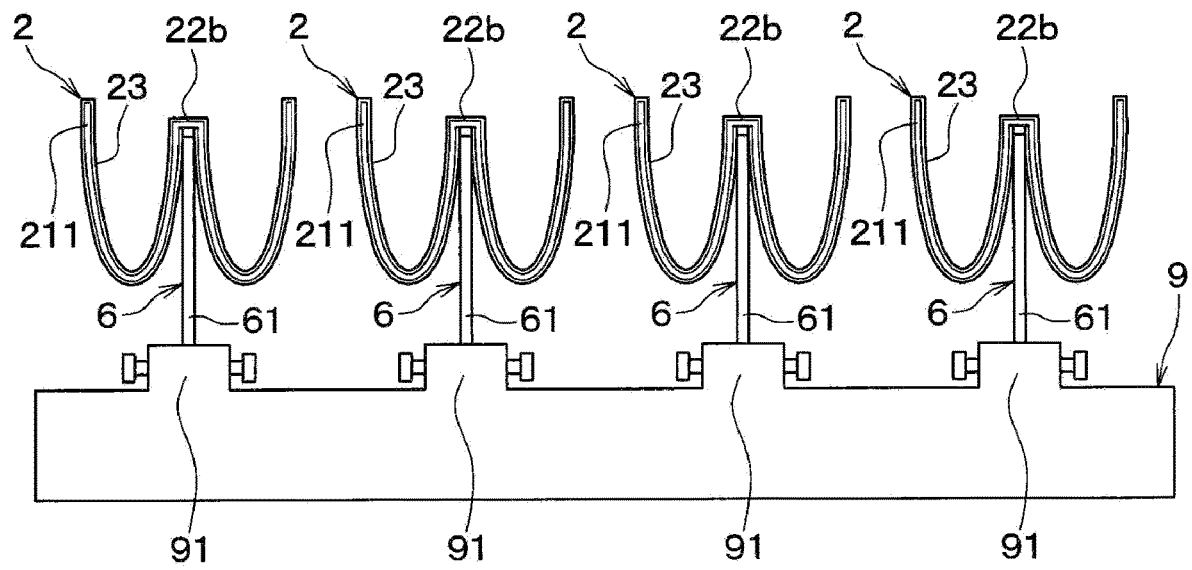
FIG. 9H is a view illustrating a manufacturing process of the inertial sensor, following FIG. 9G.
Figure 9I:
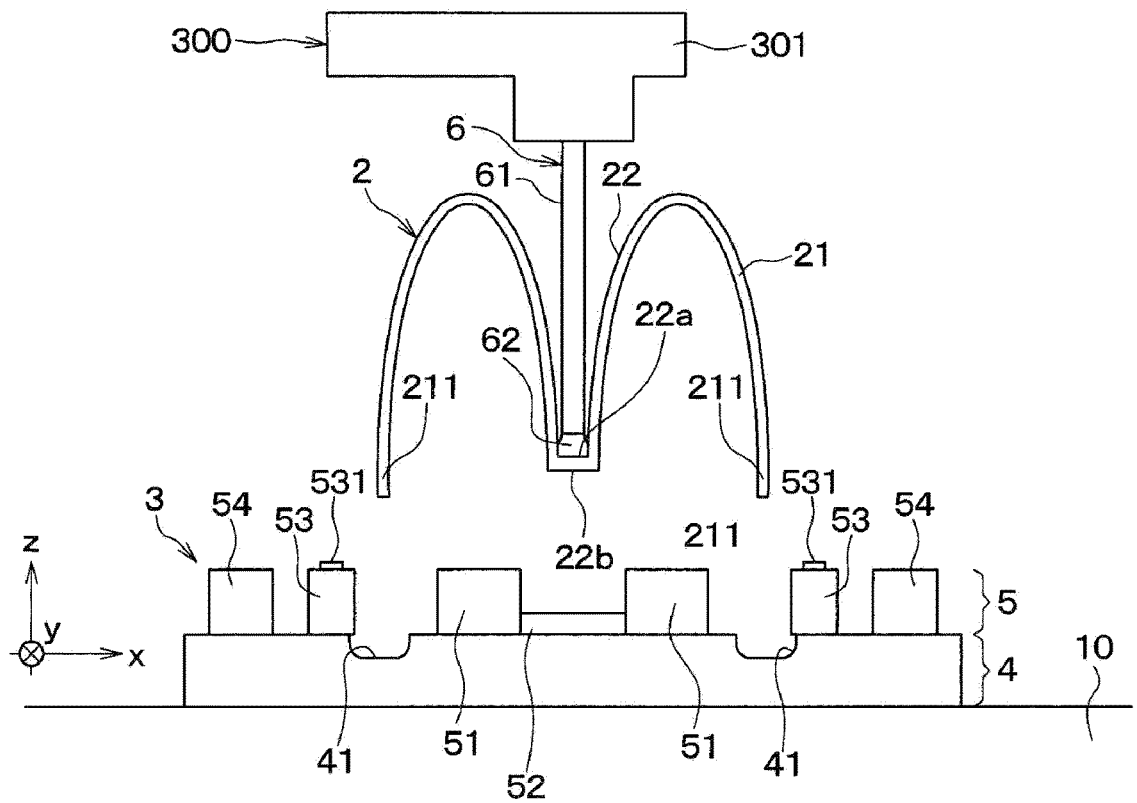
FIG. 9I is a view illustrating a manufacturing process of the inertial sensor, following FIG. 9H.
Figure 9J:
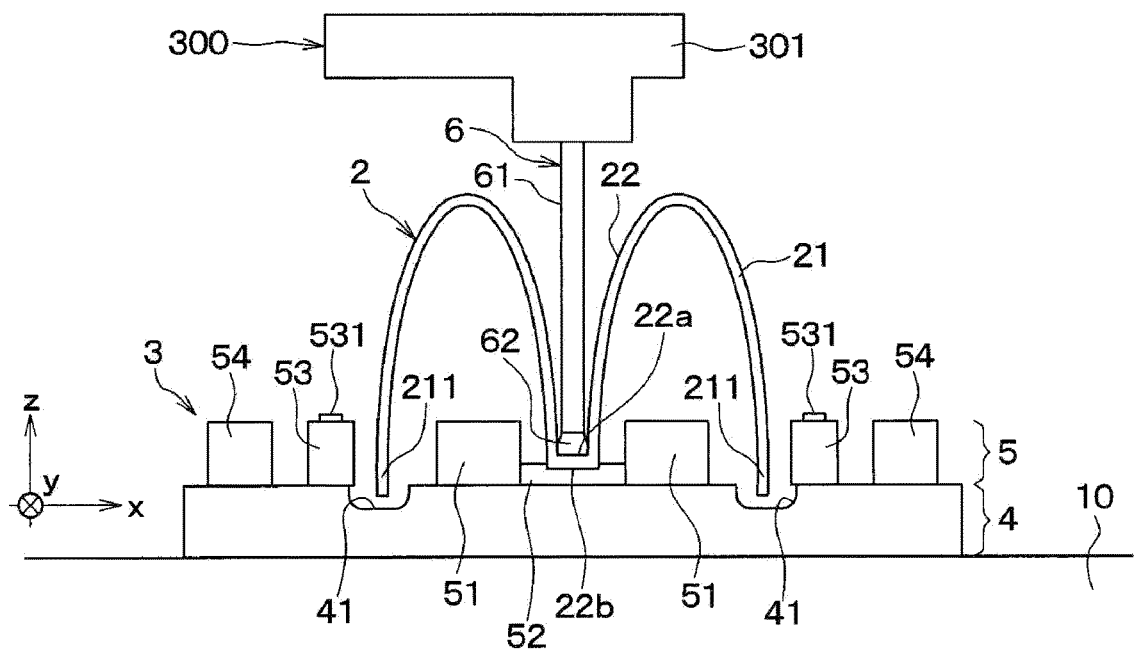
FIG. 9J is a view illustrating a manufacturing process of the inertial sensor, following FIG. 9I.
Figure 9K:
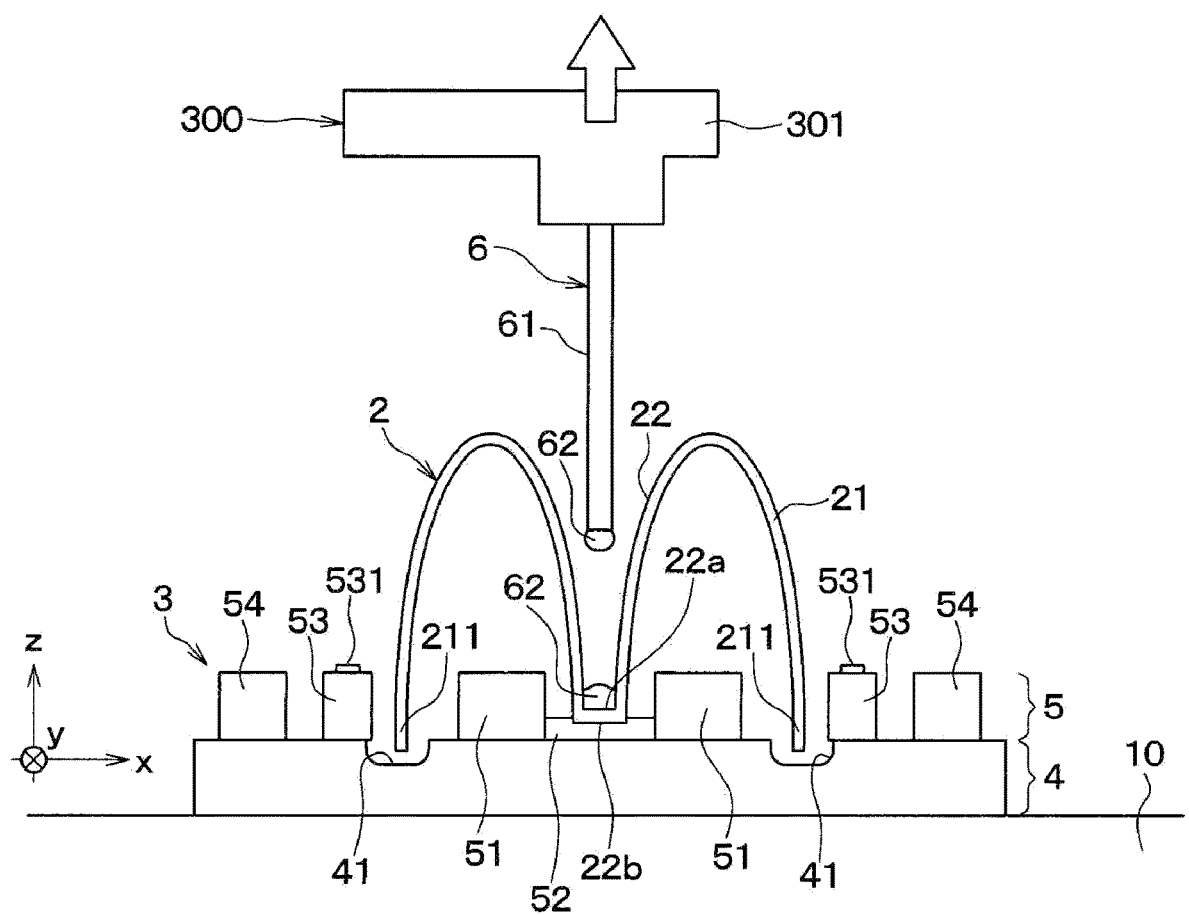
FIG. 9K is a view illustrating a manufacturing process of the inertial sensor, following FIG. 9J.

In FIGS. 9I to 9K, the conductive layer 23 formed on the micro-vibrating body 2 is omitted for easy viewing.

First, as shown in FIG. 9A, the rod 61 is prepared. The diameter and the length of the rod 61 are appropriately changed according to the inner diameter and depth of the recess 22 of the micro-vibrating body 2.

Subsequently, as shown in FIG. 9B, the adhesive member 62 is melted into a liquid material 621 stored in a container 7, and the end surface of the rod 61 is brought into contact with the liquid material 621. After that, the rod 61 is pulled out from the container 7 to solidify the liquid material 621. Thus, the support member 6 can be formed in which the adhesive member 62 is arranged on the tip surface of the rod 61 as shown in FIG. 9C.

Further, as shown in FIG. 9D, the micro-vibrating body 2 formed by the above step is prepared, and the mounting surface 22b of the recess 22 of the micro-vibrating body 2 is placed on a convex portion 81 of a pedestal 8 having a heating mechanism 82. The convex portion 81 of the pedestal 8 has an upper surface 81a which is a flat surface. When the recess 22 of the micro-vibrating body 2 is placed, the rim 211 is not in contact with other members in a hollow state.

Next, as shown in FIG. 9E, the support member 6 is inserted into the recess 22 by a transport mechanism (not shown) or the like, and the adhesive member 62 is brought into close contact with the connecting surface 22a of the recess 22. At this time, the convex portion 81 of the pedestal 8 has a temperature at which the adhesive member 62 melts (for example, 300° C.). The adhesive member 62 melts and spreads wet on the connecting surface 22a while contacting the rod 61.

After that, the heating mechanism 82 of the pedestal 8 is turned off, so that the convex portion 81 is set to a temperature lower than the melting point of the adhesive member 62.

Therefore, the adhesive member 62 is solidified, and the rod 61 and the micro-vibrating body 2 are fixed. At this point, the support structure 100 of the micro-vibrating body 2 is formed. Then, as shown in FIG. 9F, the support member 6 is pulled up by a transport mechanism (not shown), and the support structure 100 is recovered from the pedestal 8.

Subsequently, as shown in FIG. 9G, the rod 61 is fixed to a film forming stage 9 of a film forming apparatus so that the micro-vibrating body 2 is in a hollow state. The "hollow state" means a state in which the micro-vibrating body 2 is fixed via the rod 61 and is not in contact with anything other than the rod 61. Further, the film forming stage 9 includes, for example, fixing portions 91 for fixing the rod 61 of the support structure 100. The fixing portions 91 are arranged at a predetermined interval, so that the support structures 100 can be arranged side by side.

Next, as shown in FIG. 9H, the conductive layer 23 is formed on the surface of the micro-vibrating body 2 by a method such as sputtering, thin film deposition, atomic layer deposition (ALD), or chemical vapor deposition (CVD). In the case of sputtering, Ar (argon) plasma is generated in a target material of a backing plate (not shown) arranged so as to face the film forming stage 9, and particles of the target material are ejected toward the micro-vibrating body 2, so that the conductive layer 23 is formed. FIG. 9H illustrates the conductive layer 23 formed only on the surface of the micro-vibrating body 2 for easy viewing, but the same conductive layer is formed as the conductive layer 23 on the surface of the rod 61 and the film forming stage 9. Further, since the adhesive member 62 is made of a material having a melting point higher than the film forming temperature (for example, 150° C.) at the time of forming the conductive layer 23, the conductive layer 23 can be formed while the support structure 100 keeps supporting the micro-vibrating body 2.

After that, as shown in FIG. 9I, the substrate 3 is fixed to a mounting stage 10, and the support structure 100 is conveyed by a pickup mechanism 300. The pickup mechanism 300 has a grip portion 301 for gripping the rod 61, and the support structure 100 can be moved to an arbitrary position by a transport mechanism (not shown). Regarding the alignment of the micro-vibrating body 2 with respect to the substrate 3, the micro-vibrating body 2 and the substrate 3 are imaged, and the feature points are extracted by edge detection by a known image processing technique to adjust the relative position.

Then, as shown in FIG. 9J, the micro-vibrating body 2 is moved by the pickup mechanism 300, such that the mounting surface 22b of the micro-vibrating body 2 and the joining member 52 of the substrate 3 are brought into contact with each other. Thus, the micro-vibrating body 2 is pressed onto the substrate 3. After mounting the micro-vibrating body 2 on the substrate 3, the joining member 52 and the adhesive member 62 are heated, and the joining member 52 is in a softened or melted state. Further, since the adhesive member 62 is made of a material having a melting point lower than that of the joining member 52, the adhesive member 62 is in a molten state.

When pressing the micro-vibrating body 2 onto the substrate 3, the mounting stage 10 may be heated to soften the joining member 52 before contact with the micro-vibrating body 2.

Subsequently, the temperature of the mounting stage 10 is lowered to be equal to or higher than the melting point of the adhesive member 62 and lower than the melting point of the joining member 52. Therefore, the joining member 52 is solidified and the adhesive member 62 is melted. Then, in this state, as shown in FIG. 9K, by retracting the pickup mechanism 300, the rod 61 and the micro-vibrating body 2 can be separated from each other. Thus, the rod 61 can be removed. Since the rod 61 is pulled up by the pickup mechanism 300 in a state where the adhesive member 62 is melted, a part of the adhesive member 62 is attached to the micro-vibrating body 2 and the rest is attached to the tip of the rod 61.

The above is the basic manufacturing process of the inertial sensor 1 using the support structure 100. By constructing the support structure 100 to transport the micro-vibrating body 2 via the rod 61, it is not necessary to directly grip the micro-vibrating body 2. Therefore, the micro-vibrating body 2 and the conductive layer 23 can be restricted from being damaged. Thus, the highly reliable and highly sensitive inertial sensor 1 can be easily manufactured without deteriorating the vibration characteristics of the micro-vibrating body 2.

In the inertial sensor 1 manufactured by the above method, a part of the adhesive member 62 remains in the recess 22 of the micro-vibrating body 2. However, a portion of the micro-vibrating body 2 that functions as a vibrator is mainly the rim 211, there is no problem in function.

According to the present embodiment, due to the support structure 100, the micro-vibrating body 2 can be easily transported without directly gripping the micro-vibrating body 2, and a highly reliable and highly sensitive inertial sensor 1 is manufactured.

Modifications of First Embodiment

Figure 10:
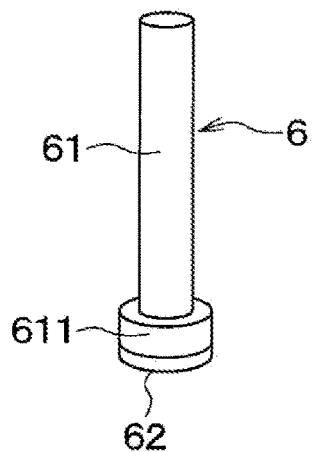
FIG. 10 is a perspective view illustrating a first modification of the rod in the support structure for the micro-vibrating body of the first embodiment.

As shown in FIG. 10, the support member 6 of the support structure 100 may have a fixing portion 611 at the tip of the rod 61. Specifically, the diameter of the fixing portion 611 about the extending direction of the rod 61 is larger than that of the rod 61. As a result, since the adhesive area between the micro-vibrating body 2 and the support member 6 is increased, the support member 6 is restricted from being fixed in an inclined state with respect to the micro-vibrating body 2.

Figure 11:
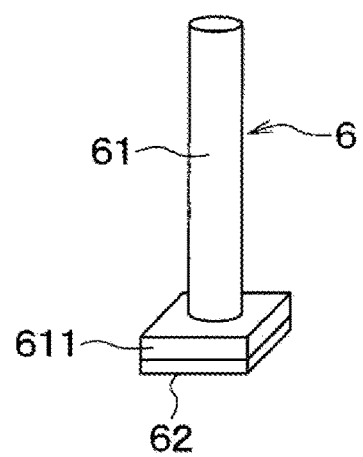
FIG. 11 is a perspective view illustrating a second modification of the rod in the support structure for the micro-vibrating body of the first embodiment.
Figure 12:
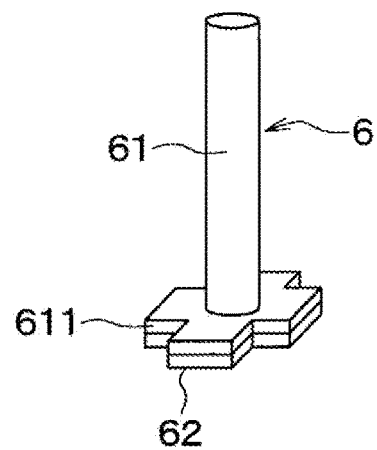
FIG. 12 is a perspective view illustrating a third modification of the rod in the support structure for the micro-vibrating body of the first embodiment.

The fixing portion 611 may be shaped in a disk as shown in FIG. 10, a rectangular plate as shown in FIG. 11 or a substantially X-shaped plate as shown in FIG. 12, while the plane size is larger than that of the column portion of the rod 61. The shape of the fixing portion 611 can be changed as appropriate while having a dimension larger than the diameter about the extending direction of the rod 61, but the plane dimension of the fixing portion 611 is smaller than the inner diameter of the recess 22 of the micro-vibrating body 2. That is, the support member 6 has a flange shape in which the diameter of the tip of the rod 61 to which the adhesive member 62 is arranged is larger than the diameter of the other portion. Since the support member 6 has the fixing portion 611, it is possible to make the rod 61 having a smaller diameter at the column portion.

Figure 13:
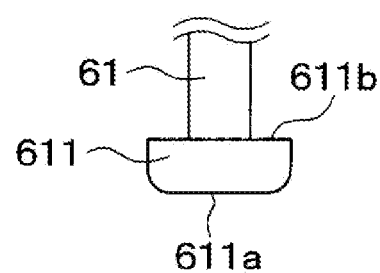
FIG. 13 is a view illustrating a fourth modification of the rod in the support structure for the micro-vibrating body of the first embodiment.

As shown in FIG. 13, the fixing portion 611 has one surface 611a on which the micro-vibrating body 2 is connected, and the other surface 611b opposite to the one surface 611a. The end of the one surface 611a is preferably located on the inner side of the end of the other surface 611b. That is, in the cross-sectional view, it is preferable that a side surface of the fixing portion 611 connecting the one surface 611a and the other surface 611b has a curved corner adjacent to the one surface 611a. In this case, when the fixing portion 611 is inserted into the micro-vibrating body 2, the fixing portion 611 can be restricted from interfering with the connecting surface 22a which is the inner bottom surface of the recess 22 of the micro-vibrating body 2. Thus, the support member 6 can be restricted from tilting with respect to the micro-vibrating body 2.

Figure 14:
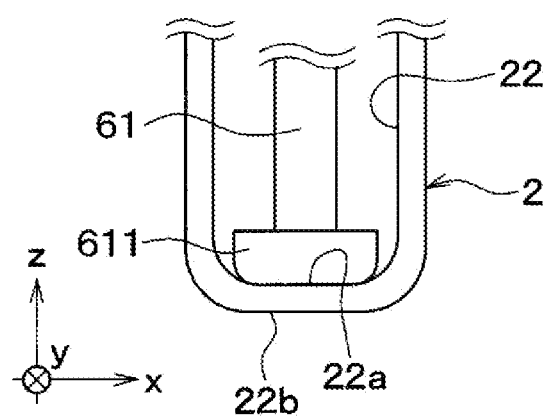
FIG. 14 is an explanatory diagram for explaining effects of the rod of the fourth modification shown in FIG. 13.

Specifically, as shown in FIG. 14, the inside of the recess 22 of the micro-vibrating body 2 has a curved shape at the end of the connecting surface 22a in the cross-sectional view. When the end of the one surface 611a of the fixing portion 611 has a right angle in the cross section, the end of the one surface 611a of the fixing portion 611 and the curved portion of the end of the connecting surface 22a come into contact with each other. In this case, the support member 6 may be tilted since the one surface 611a becomes tilted with respect to the connecting surface 22a.

However, when the end of the one surface 611a of the fixing portion 611 has a curved shape along the end of the connecting surface 22a as shown in FIG. 14, the interference between the end of the one surface 611a and the end of the connecting surface 22a, that is, contact with each other is suppressed. As a result, it is possible to restrict the one surface 611a of the fixing portion 611 from tilting with respect to the connecting surface 22a. Thus, it is possible to restrict the support member 6 from coming into contact with the micro-vibrating body 2 at an unintended location.

In FIGS. 13 and 14, the adhesive member 62 is omitted for easy viewing. This also applies to FIGS. 15A to 16B described later.

Figure 15A:
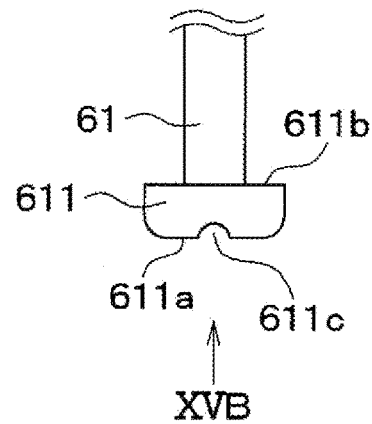
FIG. 15A is a view illustrating a fifth modification of the rod in the support structure for the micro-vibrating body of the first embodiment.
Figure 15B:
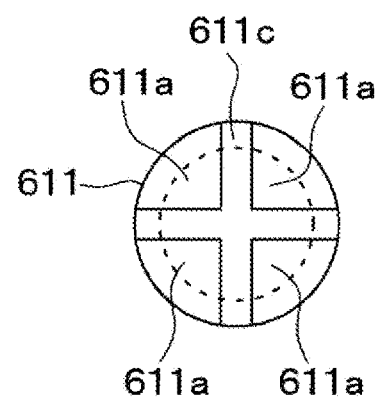
FIG. 15B is a view seen in an arrow direction XVB of FIG. 15A.

Further, as shown in FIG. 15A, the fixing portion 611 may have a groove portion 611c on the one surface 611a. As a result, when the support member 6 is fixed to the micro-vibrating body 2, the excess portion of the molten adhesive member 62 flows into the groove portion 611c. As a result, it is possible to restrict the excessive adhesive member 62 from interposing between the one surface 611a and the connecting surface 22a. Thus, the support member 6 is restricted from tilting with respect to the micro-vibrating body 2. As shown in FIG. 15B, the groove portion 611c has a substantially X-shape in which two grooves are orthogonal to each other when the support member 6 is viewed from the XVB direction in FIG. 15A, but is limited to this example. The shape, size, and the like of the groove portion 611c can be changed as appropriate.

Figure 15C:
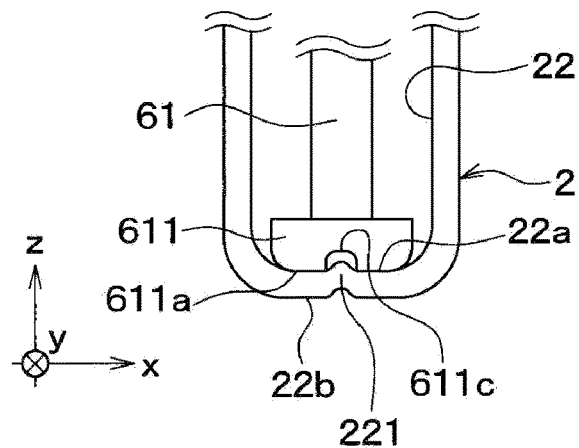
FIG. 15C is an explanatory diagram for explaining effects of the rod of the fifth modification shown in FIG. 15A.

Further, even when an unintended protrusion 221 is formed on the connecting surface 22a of the recess 22 of the micro-vibrating body 2 as shown in FIG. 15C, the groove portion 611c can be arranged so as to straddle the unintended protrusion 221. As a result, even if the protrusion 221 is present on the connecting surface 22a, the one surface 611a can be arranged in parallel to a part of the connecting surface 22a different from the protrusion 221. Thus, the support member 6 can be restricted from being tilted with respect to the micro-vibrating body 2.

Figure 16A:
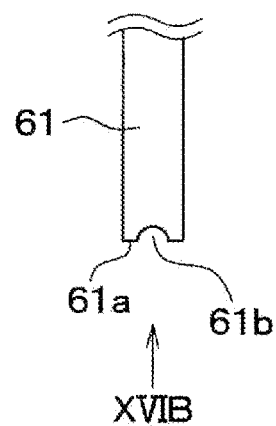
FIG. 16A is a view illustrating a sixth modification of the rod in the support structure for the micro-vibrating body of the first embodiment.
Figure 16B:
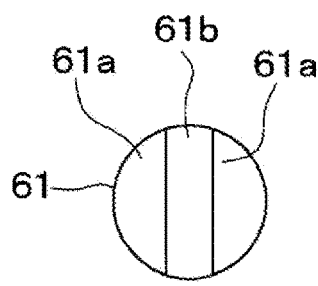
FIG. 16B is a view seen in an arrow direction XVIB of FIG. 16A.

As shown in FIG. 16A, the support member 6 may not have the fixing portion 611, and the groove portion 61b is provided on the tip surface 61a on which the adhesive member 62 is arranged. Even with such a configuration, the support member 6 can be restricted from tilting with respect to the micro-vibrating body 2 even if the protrusion 221 is present on the connecting surface 22a, as in case where the fixing portion 611 has the groove portion 611c. As shown in FIG. 16B, the groove portion 61b is a linear groove that divides the tip surface 61a into two when the support member 6 is viewed in the XVIB direction of FIG. 16A, but is not limited to this. The shape, size, and the like can be changed as appropriate.

Also in the modifications, the support structure 100 can obtain the same effect as that of the first embodiment. Specifically, the highly reliable and highly sensitive inertial sensor 1 can be easily manufactured. Further, by using the rod 61 having the fixing portion 611, the effect of suppressing the inclination of the support member 6 can be obtained. Further, when the fixing portion 611 has the groove portion 611c, or when the rod 61 does not have the fixing portion 611 and the tip surface 61a has the groove portion 61b, the effect of suppressing the inclination of the support member 6 can be obtained if the protrusion 221 is present on the connecting surface 22a of the recess 22.

Second Embodiment

Figure 17:
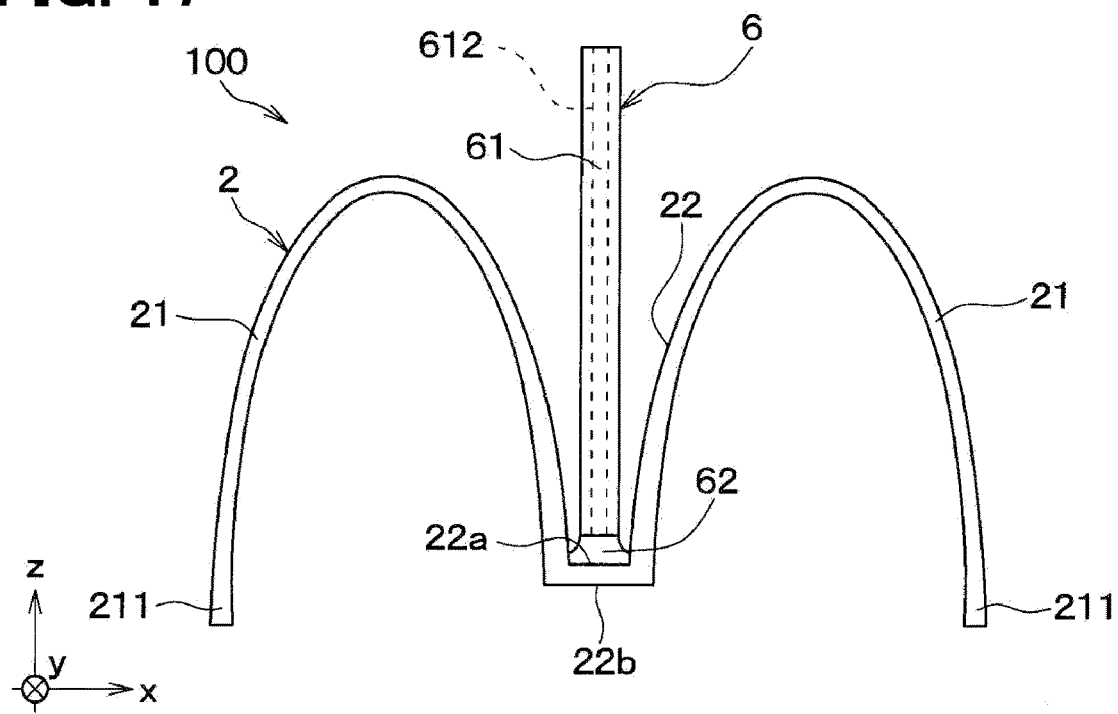
FIG. 17 is a view illustrating a support structure for a micro-vibrating body according to a second embodiment.
Figure 18:
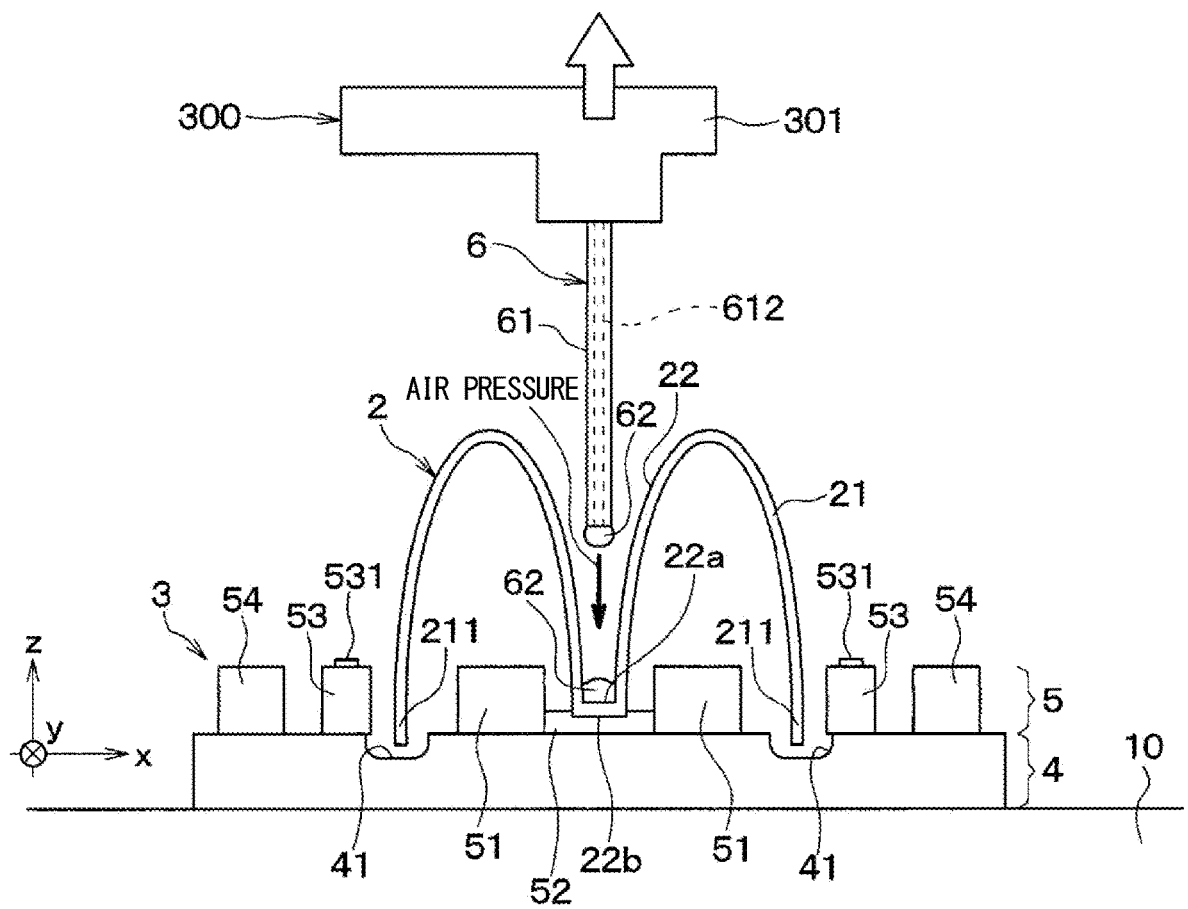
FIG. 18 is a view illustrating a process of removing a rod when the support structure of the second embodiment is used, corresponding to FIG. 9K in the manufacturing process of the inertial sensor.

The support structure 100 of the second embodiment will be described with reference to FIGS. 17 and 18. In FIGS. 17 and 18, in order to make the configuration easy to understand, a through hole 612, which will be described later and cannot be visually recognized from the outside, is shown by a broken line.

The support structure 100 of the present embodiment is different from the first embodiment in that, for example, as shown in FIG. 17, the rod 61 of the support member 6 has the through hole 612 along the extending direction of the rod 61. This difference will be mainly described in the present embodiment.

In the present embodiment, the rod 61 of the support member 6 has a tubular shape having the through hole 612 along the extending direction of the rod 61. The through hole 612 is a fluid passage provided for discharging a fluid such as compressed air to the outside, and is used when removing the rod 61 from the micro-vibrating body 2 after joining the micro-vibrating body 2 to the substrate 3.

Specifically, as shown in FIG. 18, compressed air is introduced into the through hole 612 from a compressed air discharger (not shown) connected to the pickup mechanism 300 in a state where the micro-vibrating body 2 is mounted on the substrate 3 and the adhesive member 62 is melted. As a result, the rod 61 and the molten adhesive member 62 are separated by air pressure. The rod 61 can be removed from the micro-vibrating body 2 by retracting the pickup mechanism 300. Even when the rod 61 is removed by this method, a part of the adhesive member 62 is attached to the micro-vibrating body 2 and the rest is attached to the tip of the rod 61.

When the rod 61 is removed from the micro-vibrating body 2 by introducing the compressed fluid into the through hole 612 as described above, the adhesive member 62 may be made of the same material as the joining member 52 or a material having the same melting point.

According to the present embodiment, similarly to the first embodiment, the support structure 100 is capable of transporting the micro-vibrating body 2 without directly gripping the micro-vibrating body 2. Therefore, a highly reliable and highly sensitive inertial sensor 1 can be manufactured. Further, by introducing the compressed fluid into the through hole 612 to separate the rod 61 from the micro-vibrating body 2, the step for separating the rod 61 can be executed with good reproducibility. Thus, the effect of improving the mass productivity of the inertial sensor 1 is also obtained.

Third Embodiment

The support structure 100 of the third embodiment will be described with reference to FIGS. 19 to 20C.

Figure 20A:
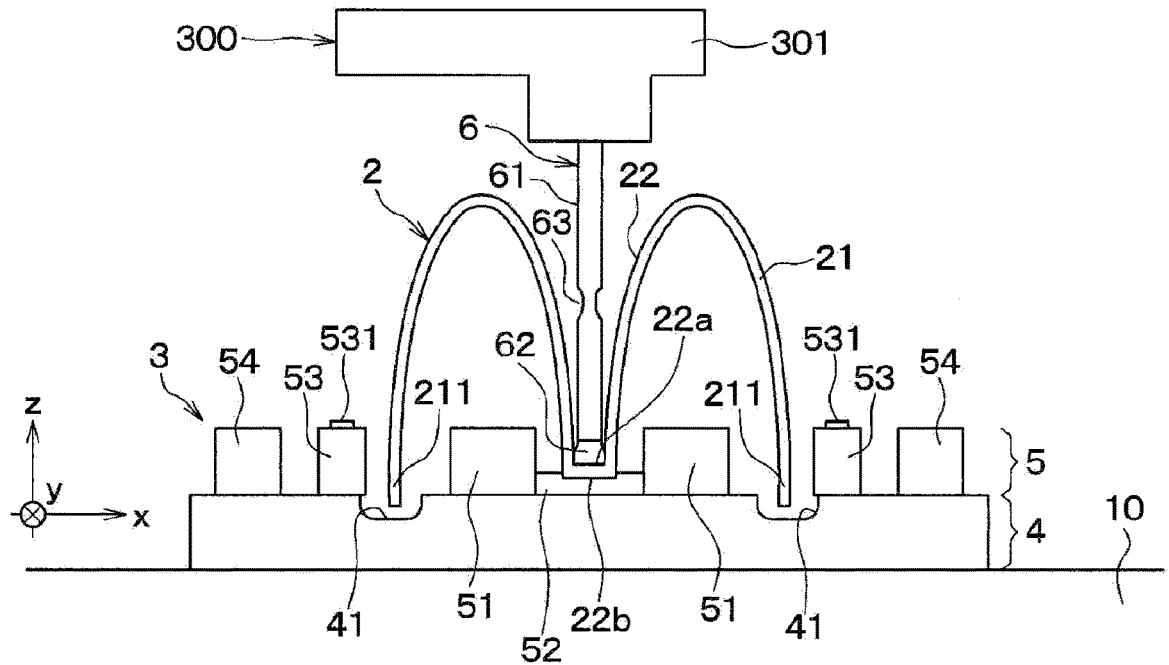
FIG. 20A is a view illustrating a process of joining a micro-vibrating body when the support structure of the third embodiment is used, corresponding to FIG. 9J in the manufacturing process of the inertial sensor.
Figure 20B:
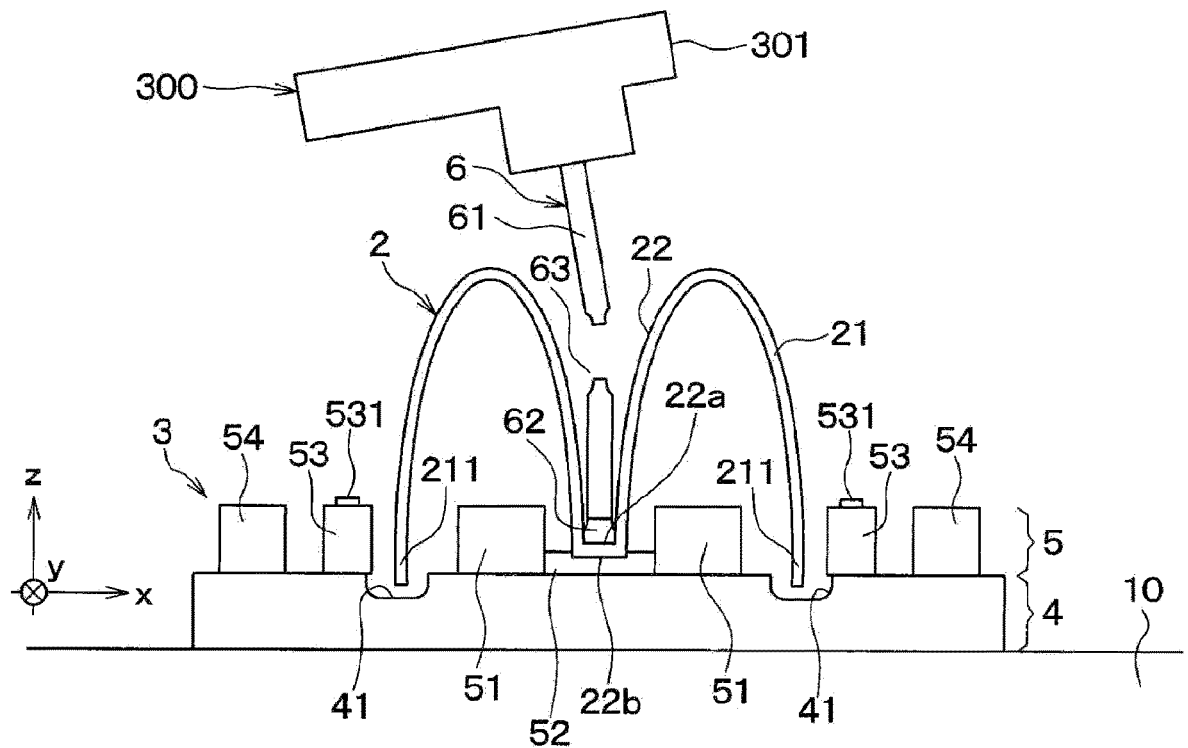
FIG. 20B is a view illustrating a process of removing a part of the rod from the micro-vibrating body, following FIG. 20A, in the manufacturing process of the inertial sensor.
Figure 20C:
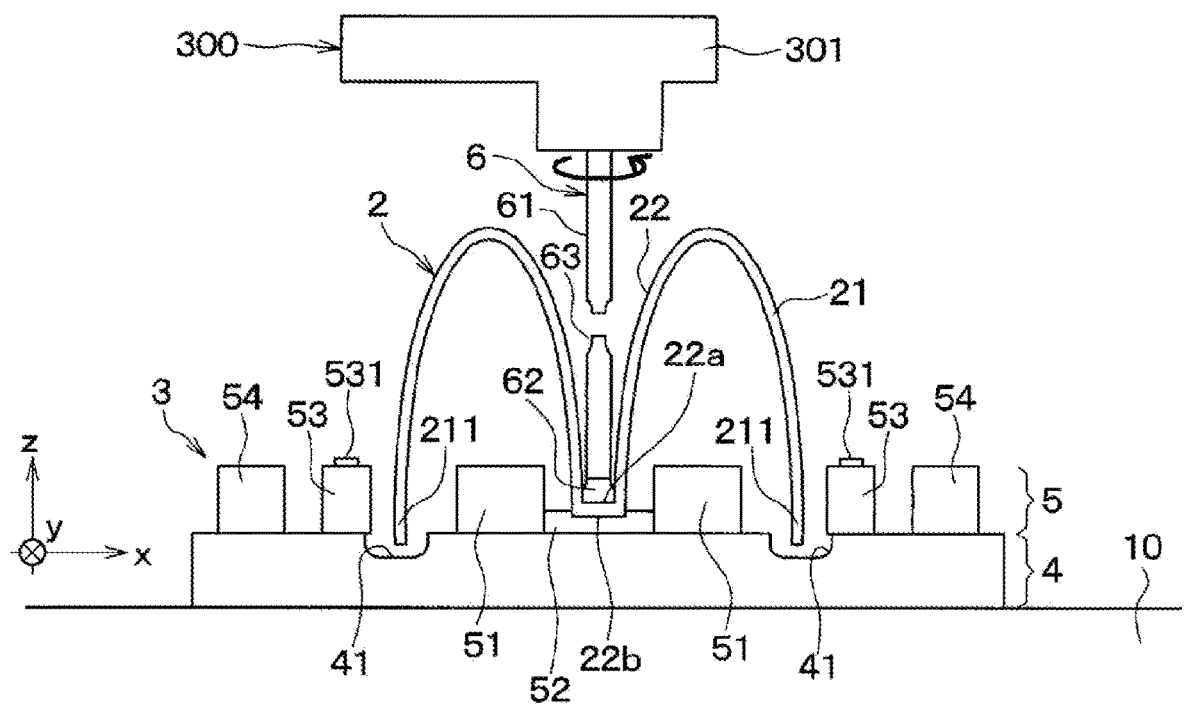
FIG. 20C is a view illustrating another process of removing a part of the rod from the micro-vibrating body, following FIG. 20A, in the manufacturing process of the inertial sensor.

FIGS. 20B and 20C are views corresponding to the separation step of the rod 61 shown in FIG. 9K in the manufacturing process of the inertial sensor 1 in the first embodiment.

Figure 19:
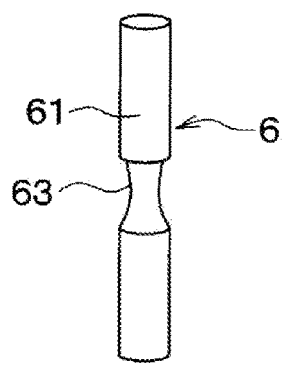
FIG. 19 is a perspective view illustrating a rod of a support structure for a micro-vibrating body according to a third embodiment.

As shown in FIG. 19, the support structure 100 of the present embodiment is different from the first embodiment in that the rod 61 of the support member 6 has a constricted portion 63. This difference will be mainly described in the present embodiment.

In the present embodiment, the rod 61 has the constricted portion 63 whose diameter about the extending direction is smaller than that of other portions. The constricted portion 63 is provided to serve as a starting point for breaking the rod 61 when the rod 61 is separated from the micro-vibrating body 2 after the micro-vibrating body 2 and the substrate 3 are joined.

Specifically, as shown in FIG. 20A, the pickup mechanism 300 grips the rod 61 having the constricted portion 63, conveys the micro-vibrating body 2 bonded by the adhesive member 62, and mounts the rod 61 on the substrate 3. Subsequently, the mounting stage 10 on which the substrate 3 is adsorbed is heated and cooled to melt the joining member 52 and the adhesive member 62 once, solidify again, such that the micro-vibrating body 2 and the substrate 3 are joined. After that, for example, as shown in FIG. 20B, stress is concentrated on the constricted portion 63 by tilting the pickup mechanism 300 diagonally while gripping one end of the rod 61. Thus, the rod 61 is broken at the constricted portion 63. Further, for example, as shown in FIG. 20C, the pickup mechanism 300 may be rotated to twist the gripped rod 61 to concentrate stress on the constricted portion 63 and break the rod 61. As a result, after joining the micro-vibrating body 2 to the substrate 3, a part of the rod 61 can be separated from the micro-vibrating body 2.

By adopting the above-mentioned support structure 100, the inertial sensor 1 has a configuration in which the remaining portion of the rod 61 is still adhered to the recess 22 of the micro-vibrating body 2. However, the functions are not affected since the rim 211 of the curved surface portion 21 functions as a vibrator of the micro-vibrating body 2. Further, in the present embodiment, the adhesive member 62 may be made of the same material as the joining member 52 or a material having the same melting point. Further, when the constricted portion 63 is provided at an arbitrary position of the rod 61, it is preferable that the constricted portion 63 is provided at a position that does not protrude from the recess 22 from the viewpoint of restricting unintended contact with other members.

Also in this embodiment, the support structure 100 can be conveyed without directly gripping the micro-vibrating body 2, and the highly reliable and highly sensitive inertial sensor 1 can be manufactured. Further, after joining the micro-vibrating body 2 to the substrate 3, a part of the rod 61 can be easily separated. Therefore, the reproducibility is good when the rod 61 is separated, and the mass productivity of the inertial sensor 1 is improved.

Other Embodiments

It is understood that the present disclosure is not limited to the embodiments. The present disclosure encompasses various modifications within an equivalence range. The embodiments above are not irrelevant to one another and can be combined appropriately unless a combination is obviously impossible.

For example, the rod 61 of the support member 6 may have the fixing portion 611 and/or the groove portion 61b in the second and third embodiments, or may have the through hole 612 in the third embodiment. In case where the rod 61 is provided with the through hole 612 in the third embodiment, it is not necessary to introduce fluid into the through hole 612, and the effect that the rod 61 can be easily broken at the constricted portion 63 can be obtained.

What is claimed is:

1. A method of manufacturing an inertial sensor comprising:
preparing a micro-vibrating body including a curved surface portion having an annular curved surface in a hollow state and a recess recessed from the curved surface portion;
preparing a support member having a rod and an adhesive member arranged at a tip end of the rod;
inserting the tip end of the rod into the recess of the micro-vibrating body to bring the adhesive member into close contact with a connecting surface which is an internal bottom surface of the recess;
melting and solidifying the adhesive member in a state where the adhesive member is in close contact with the connecting surface, to form a support structure in which the rod and the micro-vibrating body are connected to each other;
conveying the micro-vibrating body using only the rod of the support structure to form a conductive layer on a surface of the micro-vibrating body after forming the support structure;
applying a joining member to an inner region of a frame-shaped mounting portion of a substrate in which the recess of the micro-vibrating body is mounted;
conveying the micro-vibrating body using only the rod of the support structure to bring a mounting surface, which is a bottom surface of the micro-vibrating body outside of the recess, into contact with the joining member;
joining the micro-vibrating body to the substrate by solidifying the joining member after heating the substrate to melt the joining member and the adhesive member; and
removing at least a part the rod from the micro-vibrating body after joining the micro-vibrating body to the substrate.

2. The method according to claim 1, wherein
the adhesive member is made of a material having a melting point higher than a film formation temperature of the conductive layer when the conductive layer is formed in the preparing of the support member, and
the support structure is fixed on a film forming apparatus via the rod to make the micro-vibrating body in the hollow state in the forming of the conductive layer.

3. The method according to claim 1, wherein
the joining member is made of a material having a melting point higher than that of the adhesive member in the applying of the joining member.

4. The method according to claim 1, wherein
the rod includes a constricted portion having a diameter smaller than that of other portions about an extending direction of the rod in the preparing of the support member, and
the rod is broken at the constricted portion after solidifying the adhesive member, to leave the at least a part of the rod in the recess of the micro-vibrating body.

* * * * *